(12) United States Patent
Yoshino

(10) Patent No.: US 7,705,384 B2
(45) Date of Patent: Apr. 27, 2010

(54) NON-VOLATILE STORAGE ELEMENT AND MANUFACTURING METHOD THEREOF

(75) Inventor: Akira Yoshino, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 861 days.

(21) Appl. No.: 11/392,907

(22) Filed: Mar. 30, 2006

(65) Prior Publication Data
US 2006/0249782 A1 Nov. 9, 2006

(30) Foreign Application Priority Data
Mar. 30, 2005 (JP) ............................. 2005-100090

(51) Int. Cl.
*H01L 29/423* (2006.01)
(52) U.S. Cl. ................. 257/296; 257/314; 257/E21.21; 257/E21.423
(58) Field of Classification Search ............ 257/E21.21, 257/E21.423, 296, 314; 365/185.22, 185.28, 365/185.03, 185.18
See application file for complete search history.

(56) References Cited
U.S. PATENT DOCUMENTS
6,735,123 B1 * 5/2004 Tripsas et al. .......... 365/185.26
2001/0055838 A1 * 12/2001 Walker et al. ............... 438/129
2002/0196665 A1 * 12/2002 Kim ....................... 365/185.22
2006/0007732 A1 * 1/2006 Yeh .......................... 365/185.1

FOREIGN PATENT DOCUMENTS
JP  2002-230988  8/2002
JP  2003-017600  1/2003

* cited by examiner

*Primary Examiner*—Zandra Smith
*Assistant Examiner*—Tsz K Chiu
(74) *Attorney, Agent, or Firm*—Young & Thompson

(57) ABSTRACT

A non-volatile storage element 100 has a silicon substrate 102, a first memory region 106*a* composed of a first lower silicon oxide film 108*a*, a first silicon nitride film 110*a*, and a first upper layer silicon oxide film 112*a* provided in this order, a second memory region 106*b* composed of a second lower layer silicon oxide film 108*b*, a second silicon nitride film 110*b*, and a second upper layer silicon oxide film 112*b* provided in this order, and a first control gate 114 and a second control gate 116 arranged on the first memory region 106*a* and the second control gate 116, respectively, on the silicon substrate 102. The silicon nitride film 110 is provided so as to be horizontal in a direction within a substrate plane.

2 Claims, 20 Drawing Sheets

($V_{CG2} = 4.0$ V, $V_D = 1.0$ V, $V_S = 0$ V)

($V_{CG1} = 4.0$ V, $V_S = 1.0$ V, $V_D = 0$ V)

$V_{CG1}$ DEPENDENCY OF WRITE CURRENT ($V_{CG1}$ = 5.5 V, $V_{DS}$ = 4.5 V)

$V_{CG1}$ DEPENDENCY OF READ CURRENT ($V_{CG1}$ = 3.3 V, $V_{DS}$ = 1.0 V)

REVERSE BIAS – MODE ($V_{CG1}$ = 3 V, $V_{CG2}$ = 4 V, $V_D$ = 1 V, $V_S$ = 0 V)

FORWARD BIAS – MODE ($V_{CG1}$ = 4 V, $V_{CG2}$ = 3 V, $V_S$ = 1 V, $V_D$ = 0 V)

NON-VOLATILE STORAGE ELEMENT AND MANUFACTURING METHOD THEREOF

This application is based on Japanese patent application NO. 2005-100090, the content of which is incorporated hereinto by reference.

BACKGROUND

1. Technical Field

The present invention relates to a non-volatile storage element including control gates and manufacturing method thereof.

2. Related Art

A structure for a twin MONOS (Metal Oxide Nitride Oxide Silicon) memory cell structure of the related art is disclosed in Japanese Laid-open patent publication NO. 2002-230988. A twin MONOS memory cell contains two control gates formed either side of a single word gate, two nitride storage members formed underneath, and underneath which two diffusion regions are formed. With a memory cell configured in this manner, it is possible to form two data saving regions at one cell, and achieve two bits per cell.

However, with this kind of twin MONOS memory cell of the related art, a word gate is formed between two control gates. Further, for example, an ONO film constituting a data saving region is formed at a word gate side wall. As a result, memory cell structure becomes larger by just the portion of the word gate width and film thickness of the ONO film, putting a limit on fine detailing.

A non-volatile memory element of a structure that does not include a word gate is disclosed in Japanese Laid-open patent publication NO. 2003-17600. FIG. 20 is a cross-sectional view showing a configuration for a cell disclosed in Japanese Laid-open patent publication NO. 2003-17600. Here, an EEPROM (Electrically Erasable and Programmable Memory) element contains a semiconductor substrate 60, first and second conductive gates 71, 72 mutually facing and respectively formed on first and second channel regions 83, 84, first and second insulating films (ONO films) 70, 65 respectively formed below and between the first and second conductive gates 71, 72 on the substrate 60, and first and second connecting regions 81, 82. The first and second connecting regions 81, 82 are of a second conductive type and limiting the first and second channel regions 83, 84 formed on the substrate 60 so as to overlap with the first and second conductive gates 71, 72 at a space of the substrate 60 there between. A non-volatile memory element of this configuration is configured in such a manner that two memory cells are connected consecutively between a pair of bit lines so as to constitute one unit cell. Each unit cell then stores two bits of data one bit at a time at each memory cell.

The non-volatile memory element disclosed in Japanese Laid-open patent publication NO. 2003-17600 is formed in the following manner. First, a pad oxidation film and a thick nitride film are sequentially formed on the semiconductor substrate. Next, the nitride film and the pad oxidation film are patterned using a photo-etching method, and windows are formed in such a manner as to expose predetermined portions of the substrate. After this, an oxidation film, nitride film, and oxidation film are formed on the nitride film containing a window in that order, with a polysilicon film being deposited on top. After this, the polysilicon film, oxidation film, nitride film, and oxidation film are etched back, so as to form a spacer-shaped first conductive gate and an ONO film composed of the oxidation film, nitride film and oxidation film in the side wall of the nitride film within the window. After this, the nitride film and pad oxidation film are removed. As a result, a first conductive gate 71 and a first insulating film (ONO film) 70 are formed as shown in FIG. 20.

Next, an oxidation film, a nitride film, and an oxidation film are deposited sequentially on the substrate surface, with a polysilicon film then being deposited on top. After this, the polysilicon film, the oxidation film, the nitride film and the oxidation film are etched back. As a result, the second conductive gate 72 and the second insulating film (ONO film) 65 facing the first conductive gate 71 formed previously are formed.

Because the non-volatile memory element disclosed in Japanese Laid-open patent publication NO. 2003-17600 is formed using the manufacturing procedure described above, it is inevitable that each ONO film is formed in a continuous manner so as to span from a bottom part of a conductive gate to a side-wall between two conductive gates. Two ONO films are therefore arranged between two conductive gates. It is therefore not possible to shorten the distance between two conductive gates to not less than the distance of two ONO films, and fine-detailing of a non-volatile memory element is therefore restricted.

Further, because the nitride film constituting an electron trapping film within the ONO film is formed so as to span from a bottom part of a conductive gate to a side wall, electrons trapped within the nitride film are dispersed within the nitride film, electron density is diluted, and retention characteristics deteriorate.

It is also necessary to form conductive gates for each unit cell one at a time. The manufacturing procedure is therefore complex and the number of manufacturing steps is substantial. Moreover, the two ONO films formed below the two conductive gates are made by a separate process and this presents the problem that variations occur in the characteristics of these films.

SUMMARY OF THE INVENTION

According to the present invention, there is provided a non-volatile storage element, including: a semiconductor substrate; a memory region provided on the semiconductor substrate in the order of a first insulating film, an electron trapping film, and a second insulating film, the electron trapping film being provided so as to be horizontal within a substrate plane direction; and a first control gate and a second control gate arranged next to each other on the memory region.

Here, the electron trapping film is formed in such a manner as to extend only in a horizontal direction substantially parallel in a direction within a substrate plane. In this way, it is possible to suppress dispersion of electrons trapped by the electron trapping film and maintain superior non-volatile storage element retention characteristics.

Further, in the event of employing an ONO film as an electron trapping film, in order to prevent electrons trapped in the nitride film from leaking out and maintain retention characteristics, it is necessary for a nitride film and oxide films formed to completely encapsulate the nitride film to have certain extent of film thicknesses. Because of this, as with the non-volatile memory element disclosed in Japanese Laid-open patent publication NO. 2003-17600, when a configuration is adopted where two ONO films are formed between two control gates (conductive gates), the two control gates are arranged spaced by an interval of the total film thickness of the two ONO films or more. As a result, there are limits placed on the fine-detailing of the non-volatile memory element.

Moreover, as a result of study carried out by the inventor, when the interval between the two control gates is made broad, it is clear that there is a problem in that read current falls.

According to the present invention, the electron trapping film is provided horizontally within the plane of the substrate and is not formed between the two control gates. It is therefore possible to make the interval between the two control gates small and fine-detailing of the non-volatile storage element is possible. Further, as it is possible to appropriately and freely set the interval between the two control gates regardless of the film thickness of the electron trapping film, it is also possible to arrange the two control gates in such a manner that read current of the non-volatile storage element becomes an appropriate value.

As for the non-volatile storage element of the invention, an insulating film of, for example, silicon oxide film, HTO (high-temperature-oxide) film, silicon nitride film, a stacked film that is a combination of these films, or the like. may be provided between the two control gates. In this way, it is possible to electrically insulate the two control gates.

Various configurations are possible for the memory region in the present invention. For example, the memory region may be constructed from a so-called ONO film where the electron trapping film is constructed from a silicon nitride film and the first insulating film and second insulating film are constructed from insulating films such as silicon oxide films etc. In this case also, an ONO film functioning as a memory region is not formed between the two control gates, the distance between the two control gates can be reduced, and fine-detailing or miniaturization of the non-volatile storage element is possible.

Further, the electron trapping film can also be made from polysilicon or metal material. Here, the metal material can be a metal body or metal oxide including high melting point metals such as Al, Hf, Co, Ti, W, and the like. The electrons trapped by the electron trapping film move within the electron trapping film due to a voltage applied at the time of a write/read operation or as a result of an own electric field formed by the trapped electrons themselves. Because of this, it is necessary to control the width of the electron trapping film in the channel direction to suppress fluctuations in spatial density of trapped electrons in order to make data retention characteristics high. At the non-volatile storage element of the present invention, the electron trapping film is not formed so as to extend as far as the side wall of the control gate, and the dispersion of trapped electrons within the electron trapping film can therefore be suppressed. Because of this, trapped electrons can be confined to within the energy wall formed at the field boundary of the electron trapping film and its surrounding insulating films even when the electron trapping film is constructed from a metal material of high electron mobility. Superior retention characteristics can therefore be maintained. This theory applies even for films where material constituting the electron trapping film is formed continuously or where the construction uses a distributed dot-shaped substance.

Further, for example, the memory region may be constructed from a dot-shaped substance such as a plurality of dot-shaped substances constituted of at least one of dielectric material, semiconductor, and metal provided so that the electron trapping films are mutually spaced from each other, and the first insulating film and second insulating film can be constructed from insulating film such as silicon oxide film or the like. The dot-shaped substances can be configured on a nano-scale and may be given various shapes such as spherical, semi-spherical, island-shaped, or columnar. In the event that the dot-shaped substance is spherical, the diameter can be taken to be approximately 5 to 10 nm. However, the size of the dot-shaped substance is by no means limited in this respect, and any size is appropriate providing that the configuration divides a memory region below one control gate into two or more regions. The dot-shaped substance may be constituted of semiconductor such as Si, Ge, Si—Ge, and the like. The dot-shaped substances may be constituted of metal or metal oxide including high melting point metals such as Al, Hf, Co, Ti, W, and the like. The dot-shaped substance may be constituted of semiconductor such as Si, Ge, Si—Ge, and the like. The dot-shaped substance may also be configured from metal atoms or clusters dispersed within a silicon oxide film. The electron trapping film may include a first plurality of dot-shaped substances made of a first material and a second plurality of dot-shaped substances made of a second material which is different from the first material. Here, the first material and the second material may be dielectric material, semiconductor, or metal. In this way, by forming the electron trapping film in a dot-shape, it is possible to keep flowing out of electrons to a minimum even in cases where part of an insulating film is damaged, and the reliability of the memory region over a long period can be improved.

According to the present invention, there is provided a method of manufacturing a non-volatile storage element containing a control gate, including: forming a stacked film in which a first insulating film, an electron trapping film, and a second insulating film are provided in this order on a semiconductor substrate; forming a sacrifice film at both sides of a control gate forming region on the stacked film in a cross-section in a gate length direction; forming a conductive film over the whole surface of the semiconductor substrate; and forming first and second control gates spaced on the control gate forming region and neighboring each other by etching back the conductive film and ensuring that the conductive film remains at a side surface of the sacrifice film.

Here, a cross-section in a gate length direction means a cross-section parallel with the gate length direction, i.e. a cross-section cut along a gate length direction.

According to the method of manufacturing the present invention, it is possible to form the first and second control gates using the same process by etching back the conductive film. The number of steps can therefore be reduced as a result of simplifying the manufacturing process. Further, it is possible to make a stacked film formed below the two control gates using the same process. This makes it possible to reduce variations in the characteristics of these memory regions. Moreover, it is possible to simplify the manufacturing process. Still further, the two control gates are formed by etching back. There are therefore no problems with positioning deviation even when the structure of the non-volatile storage element is fine-detailed, and improved manufacturing stability can therefore be maintained.

As for the method of manufacturing a non-volatile storage element according to the present invention, in the forming the conductive film over the whole of the semiconductor substrate, the conductive film may be formed in such a manner as to have a film thickness of less than half of a length L in a cross-section in a gate length direction of the control gate forming region.

According to the present invention, it is possible to reduce element size and improve reliability of two bits per cell memory elements.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Next, a description is given using the drawings of a preferred embodiment of the present invention. In all of the drawings, the same elements of the configuration are given the same numerals and descriptions thereof are not repeated.

In the following embodiments, a non-volatile storage element has a semiconductor substrate, a memory region composed of a first silicon oxide film constituting a first insulating film, a silicon nitride film constituting an electron trapping film, and a second silicon oxide film constituting a second insulating film provided in this order on the semiconductor substrate, and a first control gate and a second control gate provided next to each other on the memory region. The silicon nitride film is provided in a horizontal direction within the plane of the substrate.

First Embodiment

Figure 1:
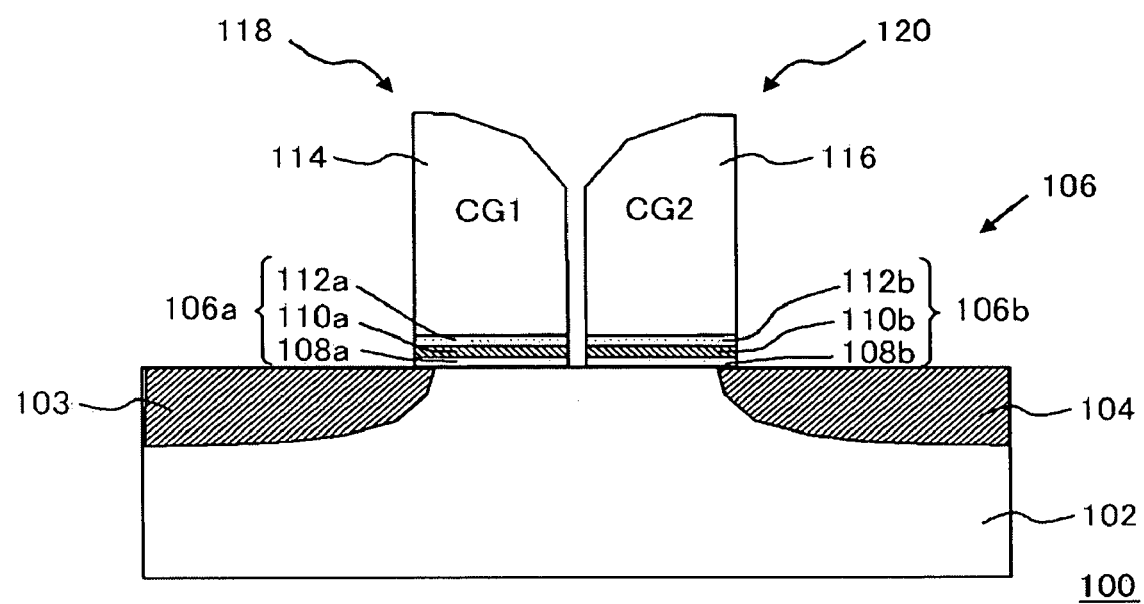
FIG. 1 is a cross-sectional view showing a configuration for a unit cell of a non-volatile storage element of an embodiment of the present invention.

FIG. 1 is a cross-sectional view showing a configuration for a unit cell of a non-volatile storage element of this embodiment.

The non-volatile storage element 100 has a silicon substrate 102, an impurity diffusion region 103 and an impurity diffusion region 104 formed apart from each other at the surface of the silicon substrate 102, and a first cell 118 and a second cell 120 provided next to each other at a channel region between the impurity diffusion region 103 and the impurity diffusion region 104.

The first cell 118 has a first memory region 106a and a first control gate 114 of a stacked structure. The second cell 120 has a second memory region 106b and a second control gate 116 of a stacked structure.

In this embodiment, a memory region 106 is configured from a stacked film where a lower layer silicon oxide film (first insulating film), a silicon nitride film (electron trapping film), and an upper layer silicon oxide film (second insulating film) are provided in that order. Further, the silicon nitride film is composed of a first silicon nitride film 110a (first electron trapping film) formed below the first control gate 114, and a second silicon nitride film 110b (second electron trapping film) formed below the second control gate 116 and provided distanced from the first silicon nitride film 110a. The memory region 106 is composed of the first memory region 106a constituted by a first lower silicon oxide film 108a, the first silicon nitride film 110a, and a first upper layer silicon oxide film 112a, and the second memory region 106b constituted by a second lower layer silicon oxide film 108b, the second silicon nitride film 110b, and a second upper layer silicon oxide film 112b. In a cross-section for the gate length direction, both end sections of the first silicon nitride film 110a and the second silicon nitride film 110b are positioned within a region right below the first control gate 114 and the second control gate 116, respectively.

The first control gate 114 and the second control gate 116 can be constructed, for example, from polysilicon. The first control gate 114 and the second control gate 116 are formed by etching back. The first control gate 114 and the second control gate 116 are formed so as to be curved in such a manner that their respective heights become lower in directions going towards each other in a cross-section in a gate length direction. The mutually facing surfaces of the first control gate 114 and the second control gate 116 are smoothly curving surfaces. By adopting this shape it is possible to achieve an element structure with superior manufacturing stability.

Figure 4D:
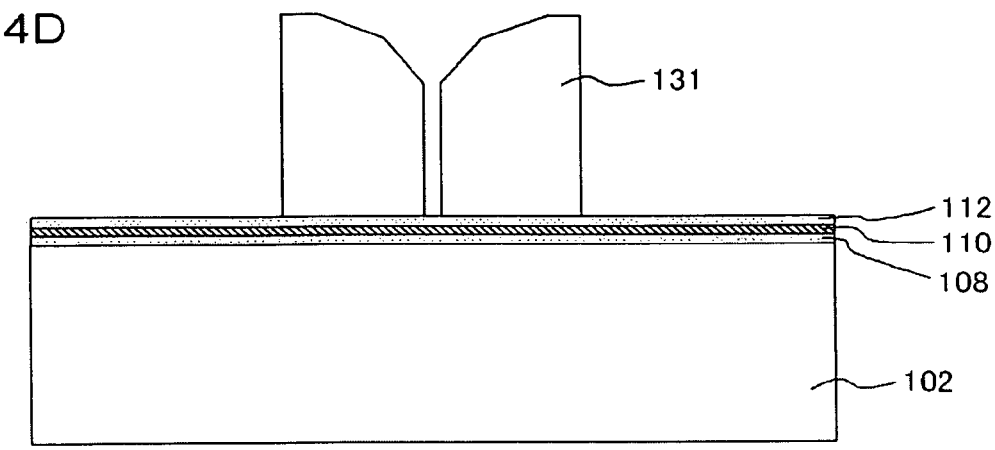
FIGS. 4D to 4F are further cross-sectional views of processes showing a procedure for manufacturing the non-volatile storage element of an embodiment of the present invention.
Figure 4E:
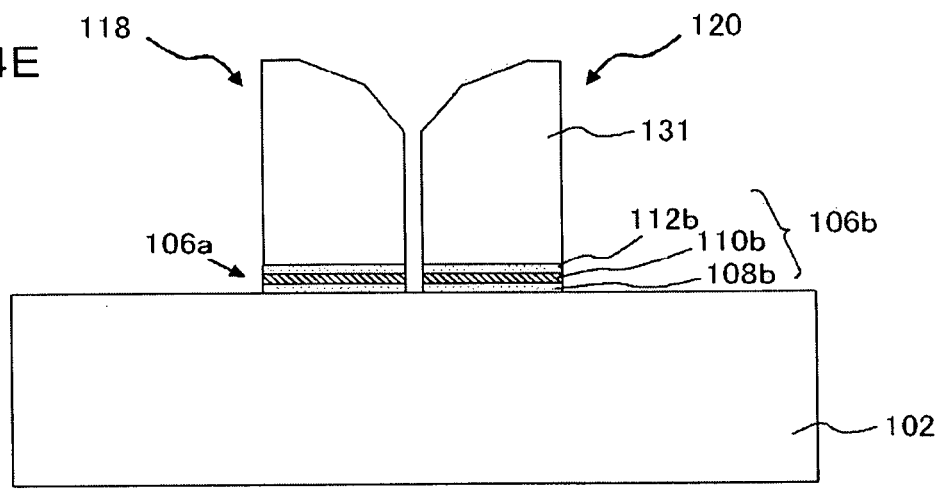
Figure 4F:
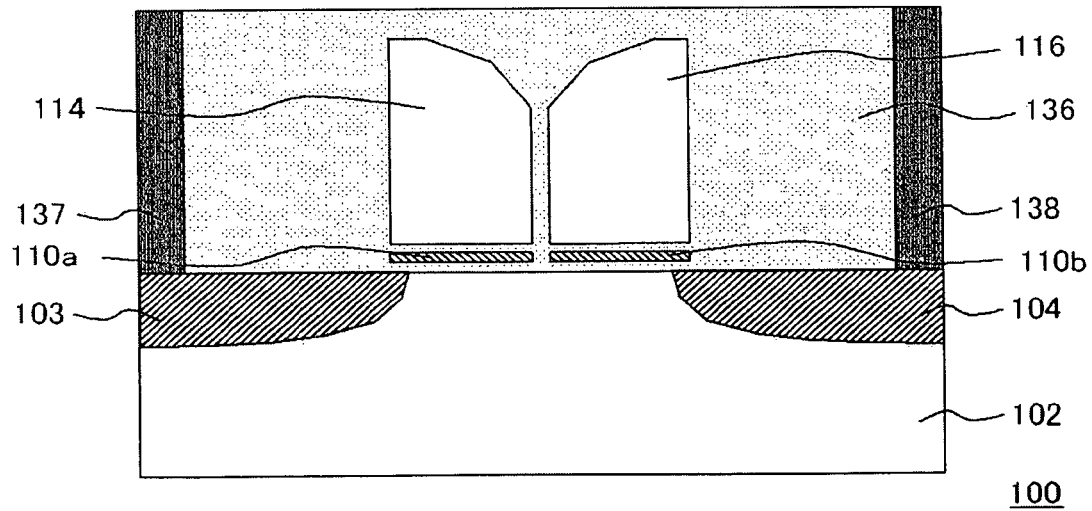

Further, although not shown in FIG. 1, the first cell 118 and the second cell 120 are embedded using a HTO (high temperature oxide) film 136 as shown in FIG. 4F described later. At the non-volatile storage element 100, an insulating film constituted by a HTO film or the like embedded between the first control gate 114 and the second control gate 116 is provided.

Next, a description is given of the operation of the non-volatile storage element 100 of this embodiment.

At the non-volatile storage element 100, at each unit cell of the non-volatile storage element 100, while data is stored at one cell and the data of this cell is read, the control gate of the remaining cell is made to function as a selection gate by independently controlling the first control gate 114 and the second control gate 116. By using this configuration, each unit cell of the non-volatile storage element 100 is capable of storing data for one bit at a time at memory regions formed under each control gate and is therefore capable of storing a total of two bits of data.

First, a description is given of operation in the case that electrons are stored at the first memory region 106a of the first cell 118. At this time, the second cell 120 functions as a selection gate.

(i) Writing

A write operation is carried out by injecting electrons at the first silicon nitride film 110a of the first memory region 106a of the first cell 118. The first control gate 114 and the second control gate 116 are independently controlled in such a manner that the channel region below the first control gate 114 and the channel region below the second control gate 116 may be put into a strong inversion state. In the event that data is written to the first memory region 106a of the first cell 118, a high voltage is applied to the first control gate 114 and a low voltage is applied to the second control gate 116. Further, a high voltage is applied to the impurity diffusion region 103 while the impurity diffusion region 104 and the silicon substrate 102 are connected to earth. The amount of current used in data writing is controlled using the voltage of the second control gate 116. As a result, electrons move from the impurity diffusion region 104 in the direction of the impurity diffusion region 103. However, the potential of the surface of the silicon substrate rises rapidly at the boundary of the second control gate 116 and the first control gate 114. Electrons flowing in from the channel region below the second control gate 116 are rapidly accelerated so as to be excited to a high-energy state and are therefore injected into the first memory region 106a of the first control gate 114.

(ii) Deletion

Deletion of data is carried out using holes generated as a result of the BTBT (band-to-band-tunneling) phenomena. When a positive voltage in the order of, for example, 6V is applied to the impurity diffusion region 103 and the impurity diffusion region 104 while a negative voltage in the order of, for example, −10V is applied to the first control gate 114 and the second control gate 116, the vicinity of a boundary surface of Si/SiO$_2$ of an n-type impurity diffusion region is depleted at an overlapping portion of the first control gate 114, the second control gate 116, and the n-type impurity diffusion region. As a result, the band structure rapidly curves in a downward direction, and valence band electrons tunnel through to a conduction band via a band gap. Electrons that have tunneled to the conduction band then flow to outside due to a positive voltage applied to the n-type impurity diffusion region. However, holes generated at the valence band travel to within the depletion layer of the n-type impurity diffusion region and the p-type channel region and are excited by a strong electric field within the depletion layer. Excited holes are then injected into the first silicon nitride film 110a and the second silicon nitride film 110b, respectively, as a result of a negative voltage applied to the first control gate 114 and the second control gate 116 and an own electric field due to electrons stored at the first memory region 106a and the second memory region 106b. When the holes reach the electrons stored within the first silicon nitride film 110a and the second silicon nitride film 110b, the holes and the stored electrons combine so as to disappear and data deletion is complete. As a result, data of cells storing electrons is collectively deleted.

(iii) Reading

In the event of reading data stored in the first memory region 106a below the first control gate 114, the impurity diffusion region 103 is connected to earth and a read voltage is applied to the impurity diffusion region 104. Further, appropriate voltages are applied to the first control gate 114 and the second control gate 116. When a certain amount of electrons is stored at the first memory region 106a, the surface potential in the vicinity of the source junction falls so that the source junction barrier becomes high and electrons can therefore not flow out from the source region to the channel region. On the other hand, if electrons are not stored at the first memory region 106a, a large amount of electrons flow out to the channel region. However, with the non-volatile storage element 100 of this embodiment, when electrons are stored by the second memory region 106b below the second control gate 116 on the drain side, the surface potential of the drain side falls due to the stored electrons. The value of the detected read current is therefore lower than the case where the second memory region 106b does not store electrons. This drop in surface potential is cancelled out at the second control gate 116 on the side of the impurity diffusion region 104 constituting a drain at the time of a read operation and a voltage higher than the first control gate 114 at the source side is therefore applied. Data of the first cell 118 can then be detected based on current taken from the impurity diffusion region 104 under these conditions.

Further, the event of reading data stored in the second memory region 106b below the second control gate 116, the impurity diffusion region 104 is connected to earth and a read voltage is applied to the impurity diffusion region 103. In this case also, as with the case of reading data from the first memory region 106a, when the first memory region 106a below the first control gate 114 stores electrons, the value of the detected read current becomes lower than in the case where electrons are not stored in the first memory region 106a. This drop in surface potential is cancelled out at the first control gate 114 on the side of the impurity diffusion region 103 constituting a drain at the time of a read operation and a voltage higher than the second control gate 116 at the source side is therefore applied.

Figure 2A:
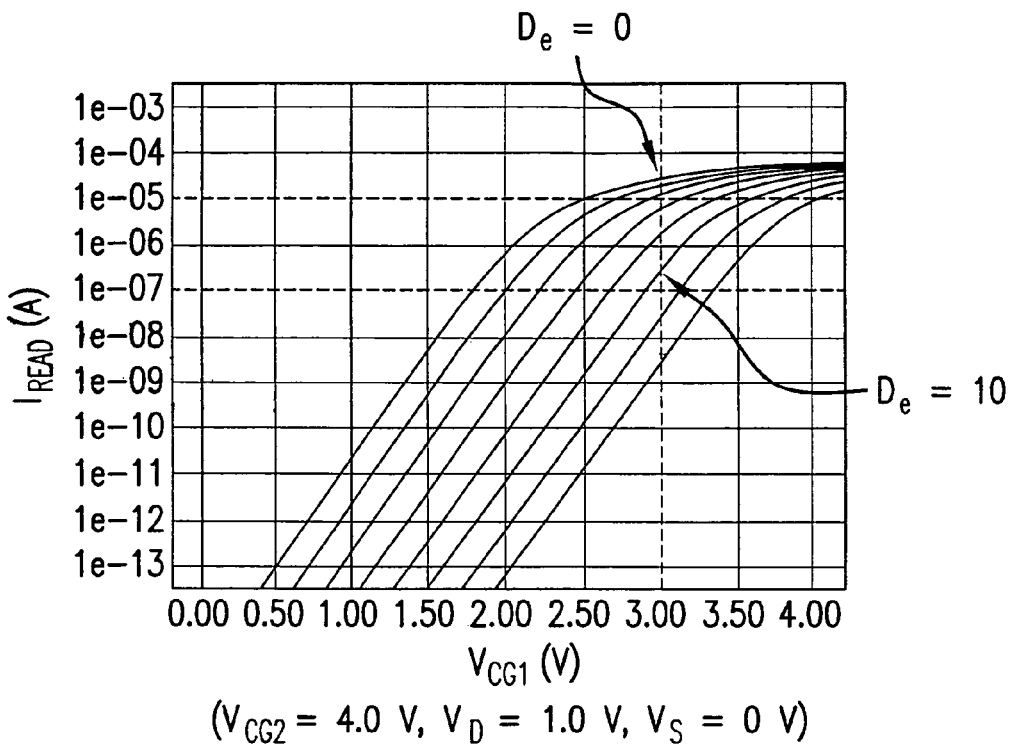
FIGS. 2A and 2B are views showing values of current flowing in reverse bias and forward bias in the event that electrons are stored at a memory region below a first control gate.
Figure 2B:
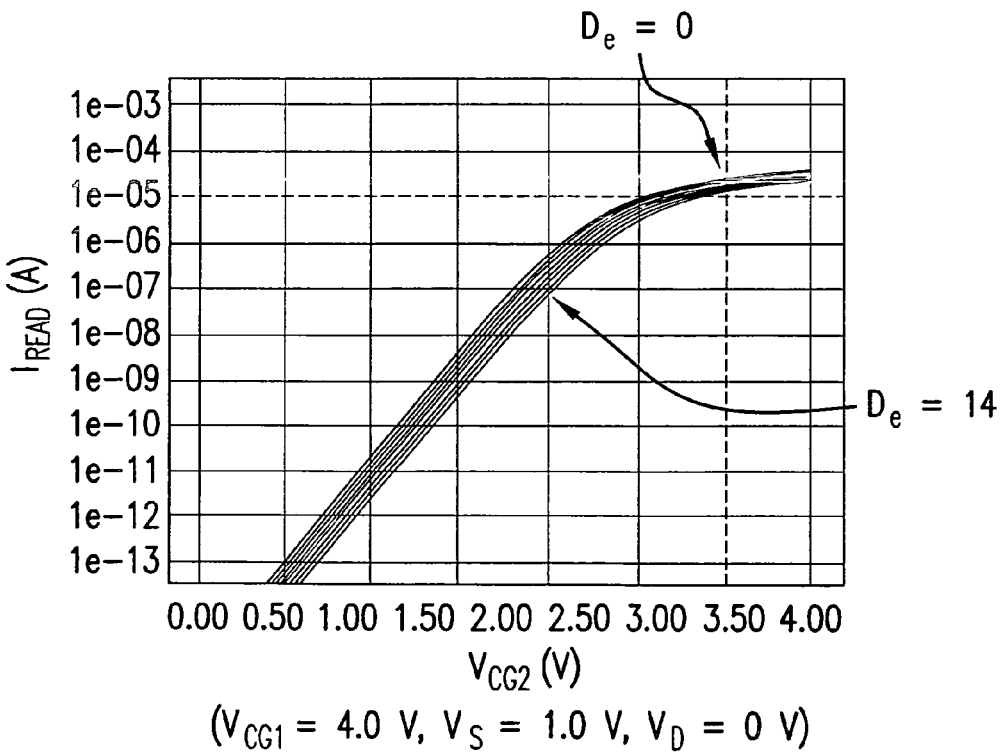

FIGS. 2A and 2B are views showing values of current flowing in reverse bias and forward bias in the event that electrons are stored at the first memory region 106a below the first control gate 114. Reverse bias is current detected at the side of the impurity diffusion region 104 and forward bias is current detected at the side of the impurity diffusion region 103. Results are shown for the case of a density $D_e$ of electrons stored at the first memory region 106a below the first control gate 114 of zero (0) to 14 ($\times 10^{18}$ cm$^{-3}$). Electrons are not stored in the second memory region 106b below the second control gate 116.

FIG. 2A is a view showing the relationship between voltage $V_{CG1}$ applied to the first control gate 114 and current $I_{READ}$ flowing in reverse bias. The electron storage state (data writing state) of the first memory region 106a below the first control gate 114 can be identified by detecting the current flowing in reverse bias.

For example, the voltage applied to the second control gate 116 is taken to be $V_{CG2}$=4V, the voltage applied to the impurity diffusion region 104 is taken to be $V_D$=1V, and the voltage of the impurity diffusion region 103 is taken to be $V_S$=0V, the read voltage $V_{CG1}$ of the first control gate 114 is made to change, and the current $I_{READ}$ flowing is measured.

For example, when a data read voltage $V_{CG1}$=3V is applied to the first control gate 114, read current ($I_{READ}$) for a deleted state is approximately 1e-5 A (approximately 20 µA), while in the case of writing with electrons of up to $D_e$=10×10$^{18}$ cm$^{-3}$, the read current ($I_{READ}$) falls down to approximately 1/100 (approximately 1e-7 A (approximately 0.02 µA)). In this way, it is possible to reliably determine the state of the memory region.

FIG. 2B is a view showing the relationship between voltage $V_{CG2}$ applied to the second control gate 116 and current $I_{READ}$ flowing in forward bias.

The voltage applied to the first control gate 114 is taken to be $V_{CG1}$=4V, the voltage applied to the impurity diffusion region 103 is taken to be $V_S$=1V, and the voltage of the impurity diffusion region 104 is taken to be $V_D$=0V, the voltage $V_{CG2}$ applied to the second control gate 116 is changed, and the current $I_{READ}$ flowing is measured.

For example, when a voltage $V_{CG2}$=3V is applied to the second control gate 116, the current is substantially fixed regardless of the presence or absence of stored electrons at the first memory region 106a below the first control gate 114 or the density of electrons.

The above results show that it is possible to accurately determine the write state of two bits by setting the values of the two control gates appropriately.

Next, a description is given with reference to the drawings of a method for manufacturing the non-volatile storage element 100 shown in FIG. 1. FIGS. 3A to 3C and FIGS. 4D to 4F are cross-sectional views of processes showing a procedure for manufacturing the non-volatile storage element 100 of this embodiment.

Figure 3A:
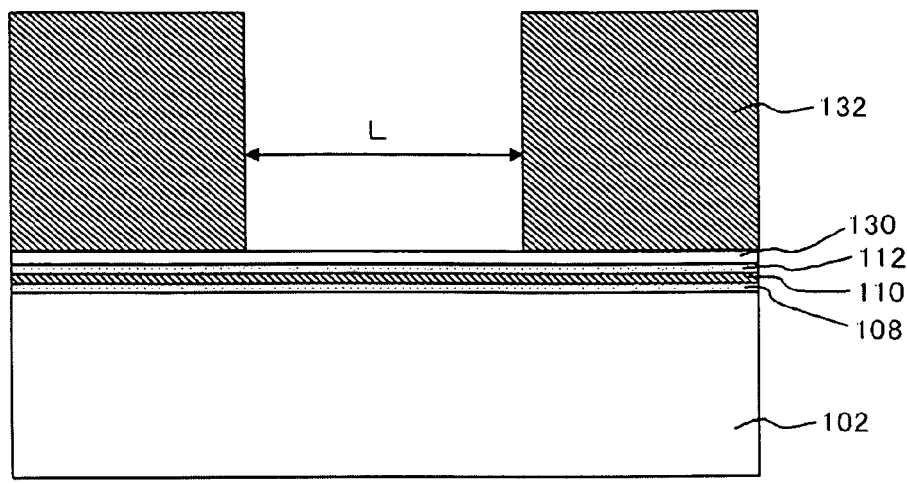
FIGS. 3A, 3B and 3C are cross-sectional views of processes showing a procedure for manufacturing the non-volatile storage element of an embodiment of the present invention.
Figure 3B:
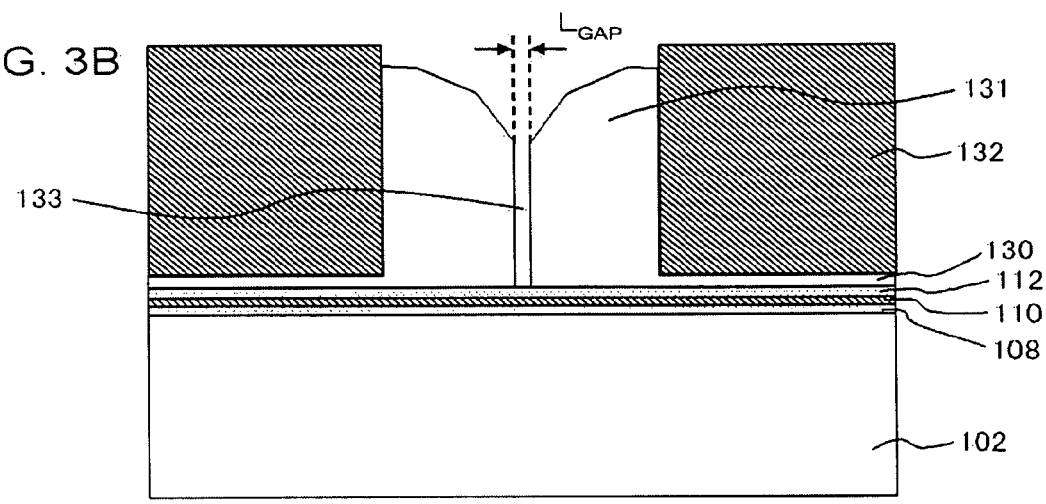
Figure 3C:
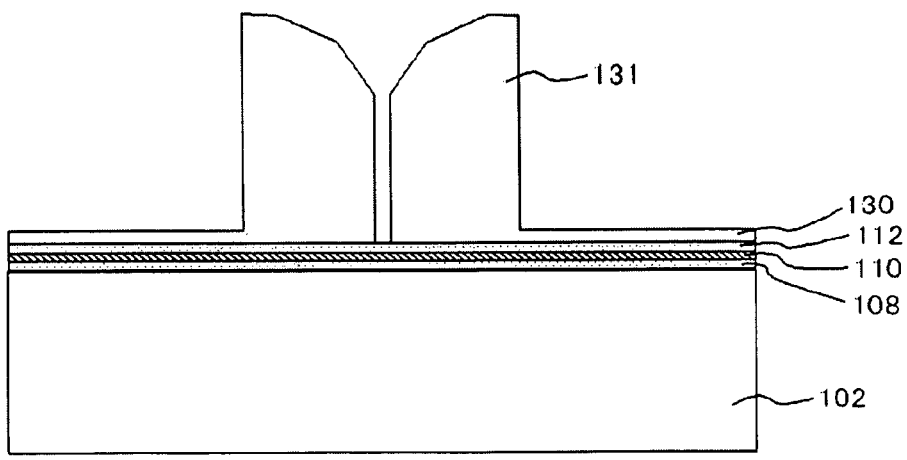

A method for manufacturing the non-volatile storage element 100 of this embodiment includes: forming a stacked film provided in the order of a lower layer silicon oxide film 108, a silicon nitride film 110, and an upper layer silicon oxide film 112 on the silicon substrate 102, forming a silicon nitride film 132 (sacrifice film) on both sides of a control gate forming region on the stacked film (FIG. 3A), forming the first control gate 114 and the second control gate 116 spaced from each other and neighboring each other on the control gate forming region by etching back the polysilicon 131 and leaving the polysilicon 131 remaining at the side surface of the silicon nitride film 132 (FIG. 3B), and removing the silicon nitride film 132 (FIG. 3C). The forming of the silicon nitride film 132 (sacrifice film) includes forming the silicon nitride film 132 over the whole surface of the stacked film, and forming an opening in the silicon nitride film 132 to form the control gate forming region. Specific processing is described in the following.

First, the lower layer silicon oxide film 108 (with a film thickness of, for example, 5 nm), the silicon nitride film 110 (with a film thickness of, for example, 5 nm), the upper layer silicon oxide film 112 (with a film thickness of, for example, 5 nm), and polysilicon 130 (with a film thickness of, for example, 10 nm) are formed on the silicon substrate 102. Here, the polysilicon 130 is shown as an example but this layer may also be amorphous silicon. After the stacked film consisting of the lower layer silicon oxide film 108, the silicon nitride film 110 and the upper layer silicon oxide film 112 is formed, the polysilicon 130 can be formed continuously on the stacked film. In this way, it is possible for the polysilicon 130 to protect the stacked film and superior film quality can be maintained for the stacked film. Continuing on, the silicon nitride film 132 (of a film thickness of, for example, 150 nm) is formed on the polysilicon 130. Next, the silicon nitride film 132 for the region where the first control gate 114 and the second control gate 116 are to be formed is removed by dry etching. Here, width L can be taken to be, for example, 80 nm (FIG. 3A).

After this, the polysilicon 131 is formed (to a film thickness of, for example, 35 nm) over the whole of the silicon substrate 102. Here, the film thickness of the polysilicon 131 can be made to be a thickness of less than half of the width L of the opening formed at the silicon nitride film 132. By adopting this film thickness, it is possible to form a gap 133 by etching back in the following step. Next, the polysilicon 131 is etched back to that the gap 133 is formed between the sidewalls of the two items of polysilicon 133. In a cross-section in a gate length direction, it is preferable for the width $L_{GAP}$ of the gap 133 to be equal to or less than 30 nm. Here, L may be 80 nm and the thickness of one polysilicon film 131 may be 35 nm, in this case, the width $L_{GAP}$ is 10 nm. As will be described later, the width $L_{GAP}$ of the gap 133 influences the read current. According to a method for manufacturing the non-volatile storage element 100 of this embodiment, it is possible to form two control gates by etching back, and forming can be achieved with superior control of the width $L_{GAP}$ of the gap 133.

Here, in a cross-section in a gate length direction, the two items of the polysilicon 131 are formed as curved shapes (FIG. 3B) of a height that becomes lower along mutually facing directions. By adopting this shape it is possible to achieve an element structure with superior manufacturing stability.

Continuing on, the silicon nitride film 132 is removed by wet etching (FIG. 3C). Next, the exposed polysilicon 130 is removed by etching back. At this time, the upper surface of the polysilicon 131 is also partially etched back at the same time (FIG. 4D).

After this, the upper layer silicon oxide film 112, the silicon nitride film 110, and the lower layer silicon oxide film 108 are selectively removed by etching back taking the polysilicon 131 as a mask. Thus, the first cell 118 and the second cell 120 are formed (FIG. 4E).

Next, a sidewall of HTO film is formed at a side surface of the polysilicon 131 by depositing and then etching back a HTO film in the order of 20 nm thick, and at the same time within the gap 133 is filled up with HTO film. Continuing on, ion injection is carried out, and the impurity diffusion region 103 and the impurity diffusion region 104 are formed respectively at the sides of the first cell 118 and the second cell 120. Next, an HTO film 136 is deposited on the first cell 118 and the second cell 120.

After this, after forming contact holes connecting to the impurity diffusion region 103 and the impurity diffusion region 104, respectively, at the HTO film 136, the contact holes are filled up with metal material so as to form a metal interconnect 137 and a metal interconnect 138 (FIG. 4F). The non-volatile storage element 100 of this embodiment is formed using the above procedure.

In the above, according to a method for manufacturing the non-volatile storage element 100 of this embodiment, the first control gate 114 and the second control gate 116 can be formed in the same process by etching back the polysilicon 131. The number of steps can therefore be reduced as a result of simplifying the manufacturing process. Further, it is also possible to form the first memory region 106a and the second memory region 106b formed below the first control gate 114 and the second control gate 116 respectively in the same step so that variations in the characteristics of the first memory region 106a and the second memory region 106b can be reduced. Moreover, it is possible to simplify the manufacturing process.

Next, a description is given using simulation results of the influence of the value of the width $L_{GAP}$ of the gap 133 between the first control gate 114 and the second control gate 116.

Figure 5A:
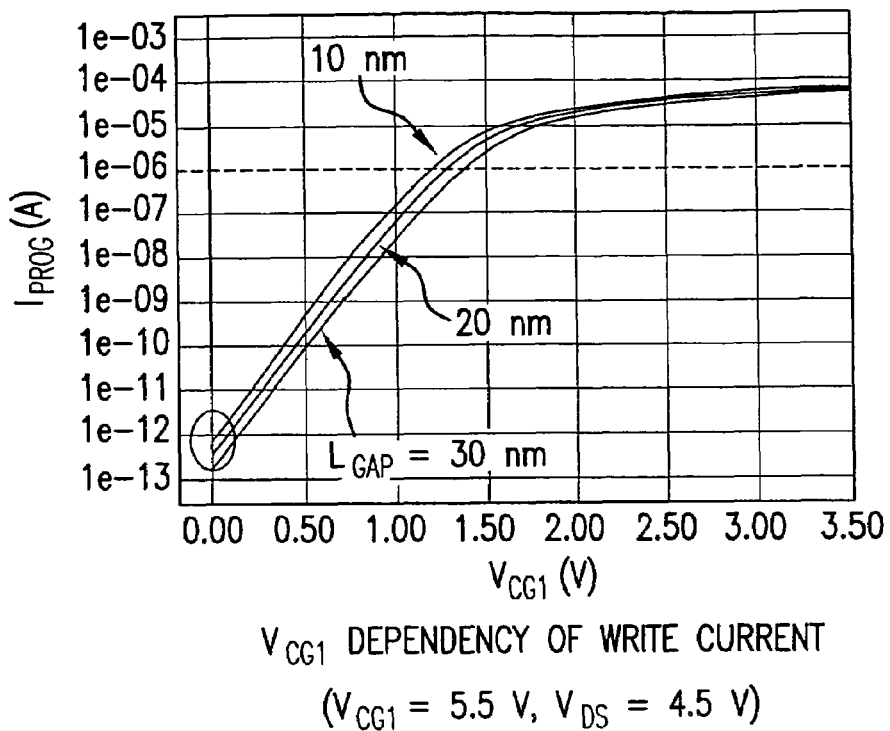
FIGS. 5A and 5B are views showing the relationship between voltage $V_{CG1}$ applied to the first control gate and write current or read current in the case that the width $L_{GAP}$ of the gap is made to be different.
Figure 5B:
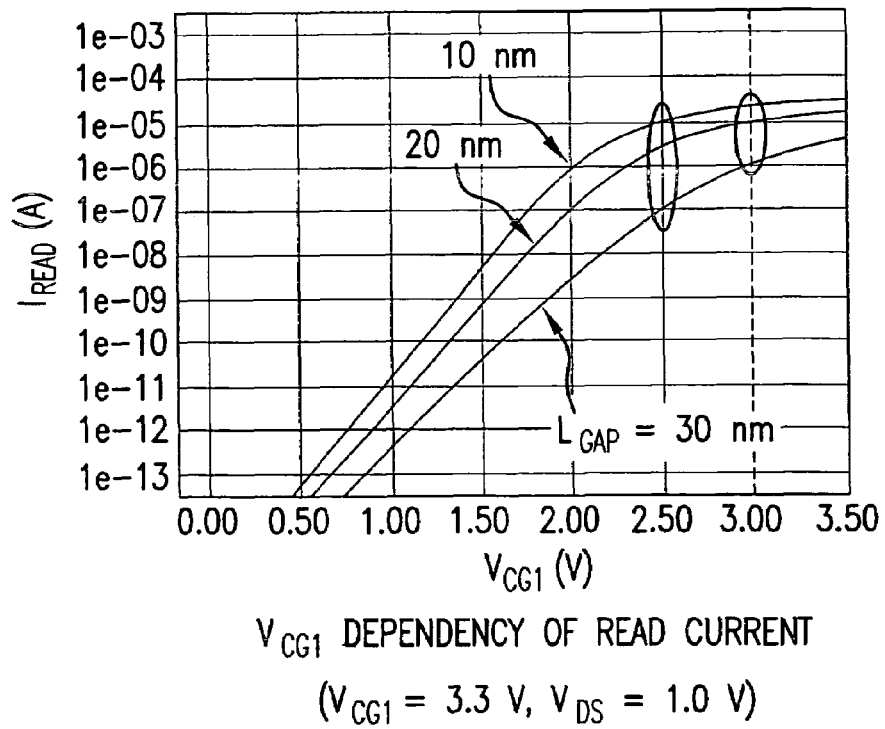

FIGS. 5A and 5B are views showing the relationship between the voltage $V_{CG1}$ applied to the first control gate 114 and the write current or read current in the case that the width $L_{GAP}$ of the gap 133 is different. Here, the gate width in a cross-section in a gate width direction of the first control gate 114 and the second control gate 116 is taken to be 300 nm, a width L of the opening shown in FIG. 3A is fixed at 80 nm, and a width $L_{cg}$ (thickness of the polysilicon film 131) in a cross-section parallel to the gate length direction of the first control gate 114 and the second control gate 116 is taken to be $(L-L_{GAP})\div 2$. In this way, at the non-volatile storage element 100, in the event that width $L_{GAP}$ of the gap 133=10 nm, 20 nm and 30 nm, then $L_{cg}$ changes to 35 nm, 30 nm, 25 nm, but the channel length of the cell as a whole is common (fixed at 80 nm).

FIG. 5A is a view showing the relationship between voltage $V_{CG1}$ applied to the first control gate 114 and write current $I_{PROG}$. Here it is taken that the voltage $V_{CG2}$ applied to the second control gate 116=5.5V, and the potential difference $V_{DS}$ between the impurity diffusion region 103 and the impurity diffusion region 104=4.5V. Even if the width $L_{GAP}$ of the gap 133 is different, a marked difference in $I_{prog}$ does not occur.

Further, at the time of a write operation, the value of leakage current (when the voltage $V_{CG1}$=0) increases slightly when the width $L_{GAP}$ of the gap 133 is narrow, but there is barely any difference, and the difference is within the permitted range. Moreover, the current used at the time of the write operation can be controlled using the voltage $V_{CG1}$ applied to the first control gate 114 and writing can therefore be carried out using a low current in the order of 1×1e−6 A.

FIG. 5B is a view showing the relationship between voltage $V_{CG1}$ applied to the first control gate 114 and the read current $I_{READ}$. Here, voltage $V_{CG2}$ applied to the second control gate 116 is taken to be 3.3V, and the difference in potential between the impurity diffusion region 103 and the impurity diffusion region 104 is taken to be 1.0V. The read current value is shown as rising rapidly when the width $L_{GAP}$ of the gap 133 becomes small.

Figure 6:
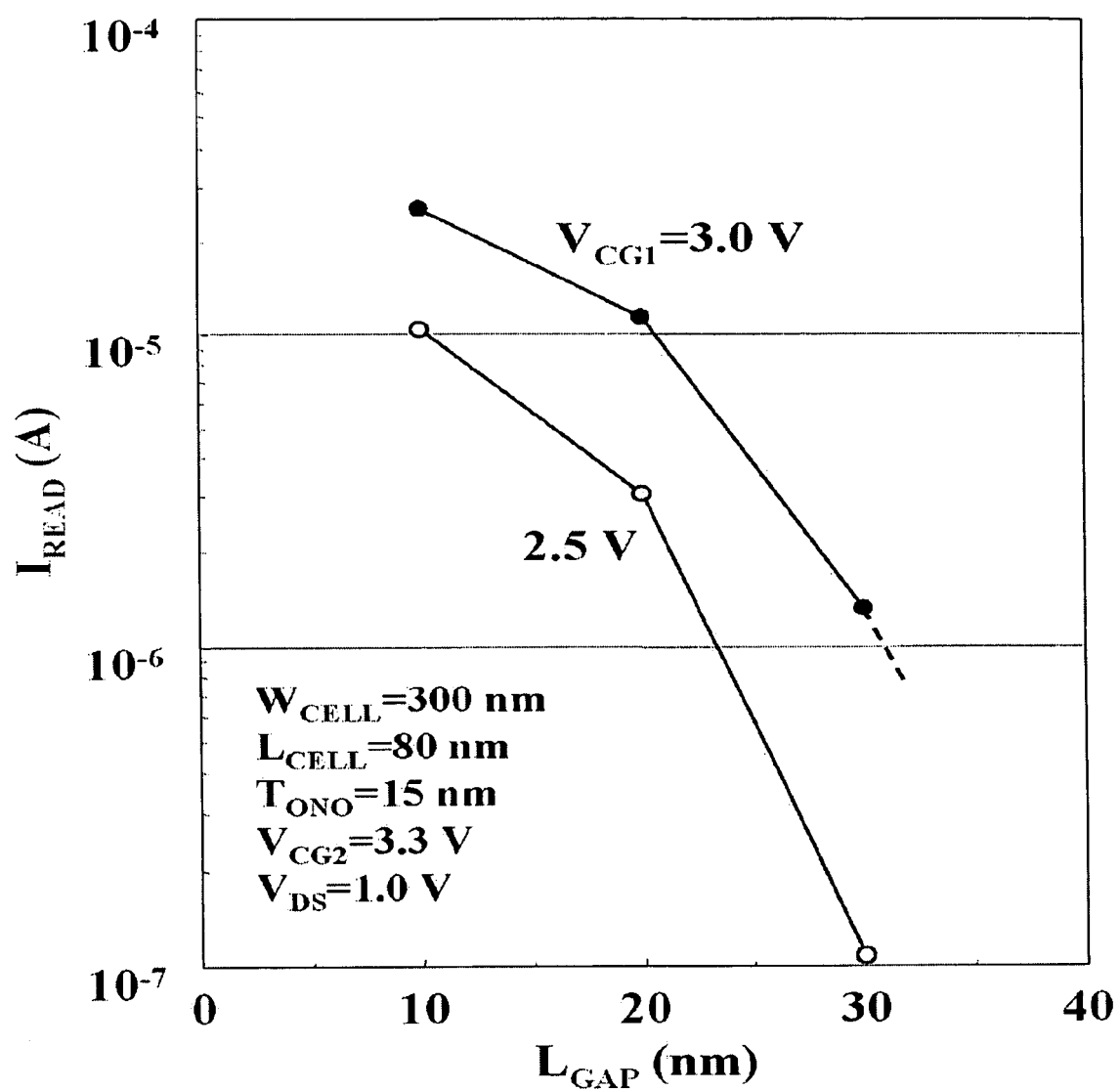
FIG. 6 is a view showing the relationship between width $L_{GAP}$ of the gap and read current $I_{READ}$ calculated based on the graph shown in FIGS. 5A and 5B.

FIG. 6 is a view showing the relationship between the width $L_{GAP}$ of the gap 133 and the read current $I_{READ}$ calculated based on the graph shown in FIGS. 5A and 5B. For example, in the case that the voltage applied to the first control gate 114 is taken to be 3V, the read current when the width $L_{GAP}$ of the gap 133 is 30 nm is approximately 1×10⁻⁶ A. As a result, when the width $L_{GAP}$ of the gap 133 becomes broader, the read current falls substantially. When the read current falls, there is the problem that more time is required for reading the data. Because of this, at the non-volatile storage element 100, it is preferable to adopt a configuration where the value of the read current becomes large. In the event that the non-volatile storage element 100 is used in a product where high-speed read out is required, it is preferable for the read current value to be in the order of 1×10⁻⁶ A when the voltage applied to the first control gate 114 is 3V. Further, by making the width $L_{GAP}$ of the gap 133 narrow, the read current value rapidly rises. Moreover, in the event that the voltage applied to the first control gate 114 is taken to be 2.5V, the read current can be made to rise rapidly by making the width $L_{GAP}$ of the gap 133 20 nm. From this viewpoint, the width $L_{GAP}$ of the gap 133 may be preferably equal to or less than 30 nm, and still more preferably equal to or less than 20 nm.

Figure 7A:
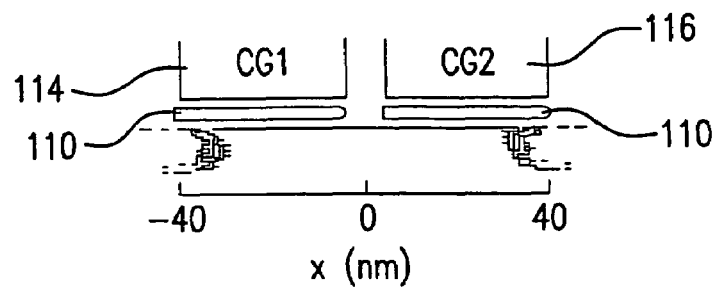
FIGS. 7A to 7C are views showing a mechanism for generating the phenomena shown in FIGS. 5A and 5B and FIG. 6.
Figure 7B:
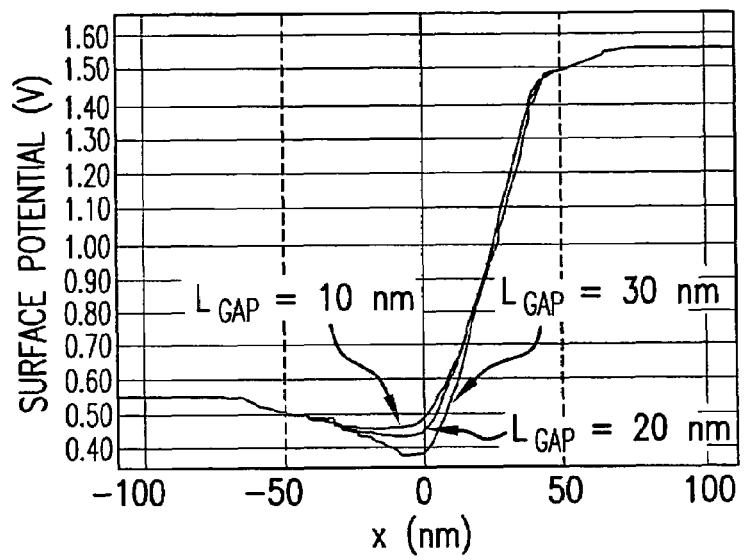
Figure 7C:
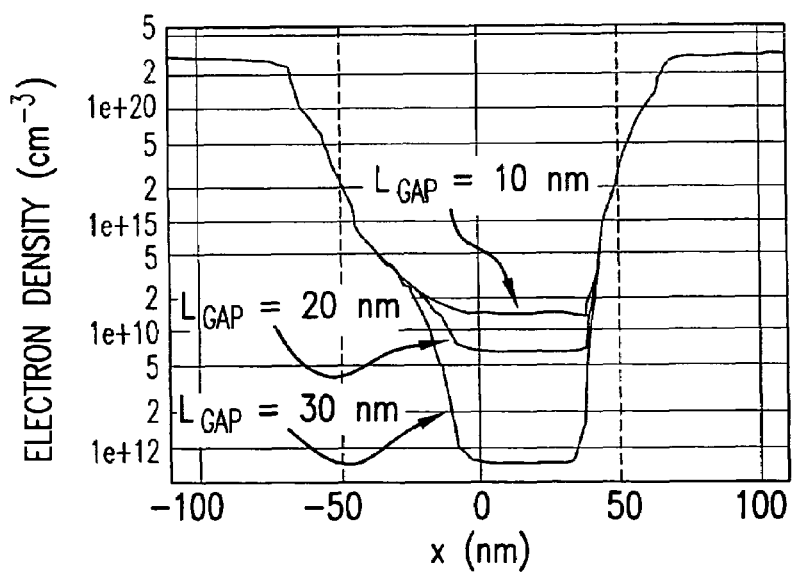

FIGS. 7A to 7C are views showing a mechanism for generating the phenomena shown in FIGS. 5A and 5B and FIG. 6. As shown in FIG. 7A, a distance in a cross-section in a gate length direction is taken to be x (nm) taking the center point of the first control gate 114 and the second control gate 116 as zero (0).

FIG. 7B shows the relationship between distance x in a channel direction and surface potential when voltage $V_{CG1}$ applied to the first control gate 114 is taken to be 3.0V, voltage $V_{CG2}$ applied to the second control gate 116 is taken to be 3.3V, the impurity diffusion region 103 is connected to earth, and potential difference $V_{DS}$ between the impurity diffusion region 103 and the impurity diffusion region 104 is taken to be 1.0V. Here, electrons are not stored at either the first memory region 106a below the first control gate 114 or the second memory region 106b below the second control gate 116. It is shown that the drop in the potential at the gap 133 in the vicinity of x=zero is smaller for a smaller width $L_{GAP}$ of the gap 133. Namely, the potential of the surface of the first control gate 114 is influenced by $V_{CG2}$, and the surface potential in the vicinity of x=0 rises more for a small width $L_{GAP}$ of the gap 133. As a result, the height of the source junction barrier is reduced, and more electrons flow from the source region into the channel region.

FIG. 7C shows the relationship between the distance x and electron density under the same conditions as for FIG. 7B.

It is shown that the electron density at the gap 133 in the vicinity of x=zero is higher for a smaller width $L_{GAP}$ of the gap 133. Namely, by making the drop in potential at the gap 133 in the vicinity of x=zero small, the height of the source junction barrier is reduced, and as a result the channel electron density increases exponentially. As a result, it can be considered that the read current increases for a smaller width $L_{GAP}$ of the gap 133.

Next, a description of the relationship between the length of the silicon nitride film 110 and the read current $I_{READ}$ in a cross-section in a gate length direction is described using simulated results.

Figure 8A:
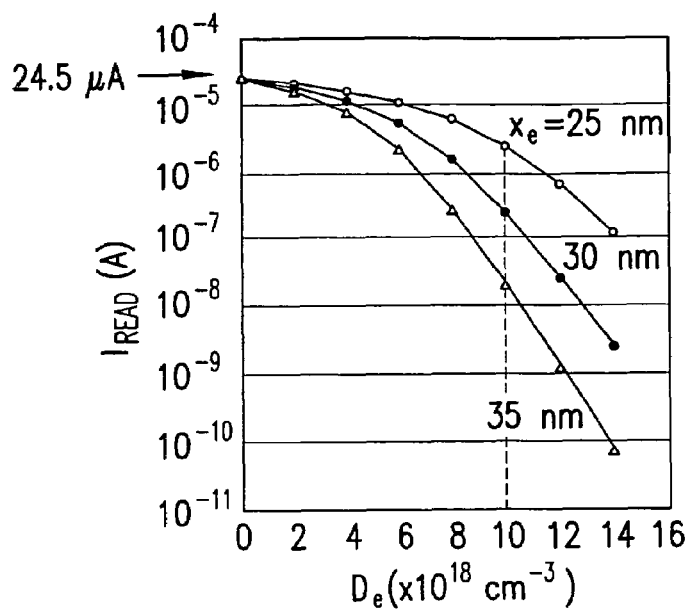
FIGS. 8A and 8B are views showing the relationship between electron density $D_e$ and read current $I_{READ}$ in reverse bias and in forward bias for different widths $X_e$ of a silicon nitride film of a memory region below the first control gate and the second control gate.
Figure 8B:
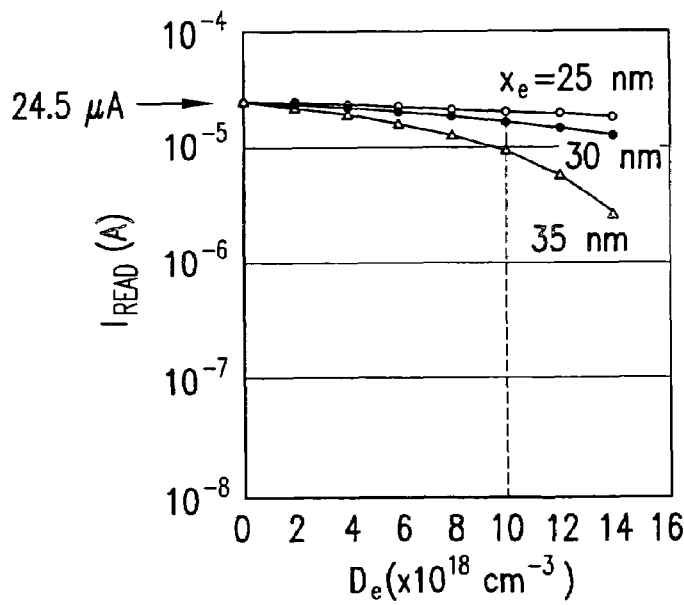

FIGS. 8A and 8B are views showing the relationship between electron density $D_e$ and current $I_{READ}$ flowing in reverse bias and forward bias in the case of different widths $X_e$ of a region for trapping electrons for the first silicon nitride film 110a and the second silicon nitride film 110b of the first memory region 106a and the second memory region 106b below the first control gate 114 and the second control gate 116, respectively. The electron trapping region can be approximated to a rectangle having a vertical length=film thickness of nitride film and horizontal length=$X_e$, so as to give the average $D_e$ value at this region. Reverse bias is current detected at the side of the impurity diffusion region 104 and forward bias is current detected at the side of the impurity diffusion region 103. Here, electron density $D_e$ shows the density of electrons stored in the first memory region 106a below the first control gate 114.

FIG. 8A shows the relationship between electron density $D_e$ and reverse bias read current $I_{READ}$. The current flowing is measured taking the voltage $V_{CG1}$ applied to the first control gate 114 to be 3V, the voltage $V_{CG2}$ applied to the second control gate 116 to be 4V, the read voltage $V_D$ applied to the impurity diffusion region 104 to be 1V, and the voltage $V_S$ of the impurity diffusion region 103 to be 0V.

FIG. 8B shows the relationship between electron density $D_e$ and forward bias read current $I_{READ}$. The current flowing is measured taking the voltage VCG1 applied to the first control gate 114 to be 4V, the voltage $V_{CG2}$ applied to the second control gate 116 to be 3V, the read voltage VD applied to the impurity diffusion region 104 to be 0V, and the voltage $V_S$ of the impurity diffusion region 103 to be 1V.

From the above results, it is shown that the reduction in read current accompanying an increase in density ($D_e$) of electrons stored in the memory region 106 is smaller for a smaller width $X_e$ of an electron trapping region of the memory region 106 for either reverse bias or forward bias.

In either of the case of $X_e$=25 nm, 30 nm, or 35 nm, the read current in the write state reduces exponentially together with an increase of $D_e$. In the event that the write state is, for example, $D_e$=10×10$^{18}$ cm$^{-3}$, the read current in the write state falls to 1/10 of that of the deleted state with $X_e$=25 nm, 1/100 of the deleted state with $X_e$=30 nm, and 1/1000 of the delete state with $X_e$=35 nm. Therefore, in the event that $D_e$=10×10$^{18}$ cm$^{-3}$, it can be understood that the width $X_e$ of the electron trapping region is preferably $X_e$>25 nm.

On the other hand, even when the memory region of the second cell 120 is in a deleted state, when the memory region of the first cell 118 is in a write state, the read current of the second cell 120 (deleted state) falls due to the influence of the stored electrons of the first cell 118. In order to alleviate this influence, it is necessary to optimize the voltages applied to the first control gate 114 and the second control gate 116 and to optimize the values of $D_e$ and $X_e$. FIG. 8B is an example of results of evaluations carried out from this viewpoint, and shows read current $I_{read}$ of an opposing bit (second cell 120, deleted state: $D_e$=0) in various states (combinations of $D_e$ and $X_e$) for the first cell 118 shown in FIG. 8A. As same as FIG. 8A, comparing using $D_e$=10×10$^{18}$, if $X_e$ of the first cell 118 in a write state is $X_e$ 30≦nm, drop in read current of the second cell 120 (deleted state) can be considerably suppressed, but in the case that $X_e$=35 nm, the read current falls about 1/10. It is therefore necessary to precisely control the bias conditions, $D_e$, and $X_e$ in order for the read current of a write state to fall sufficiently and a read current of an opposing bit in a deleted state to be kept high.

In this embodiment, in the case, for example, that the density of electrons stored in the memory region 106 is 10×10$^{18}$ cm$^{-3}$, it is shown that it is possible to attain appropriate currents in reverse bias and forward bias by putting $X_e$=30 nm.

In the above, according to the non-volatile storage element 100 of this embodiment, the first silicon nitride film 110a and the second silicon nitride film 110b of the first memory region 106a and the second memory region 106b are formed so as to extend only in a horizontal direction in respective directions within the substrate plane. Because of this, it is possible to suppress dispersion of electrons trapped in the first silicon nitride film 110a and the second silicon nitride film 110b and it is possible for superior retention characteristics to be maintained for the first silicon nitride film 110a and the second silicon nitride film 110b.

Further, it is possible to make an interval between the first control gate 114 and the second control gate 116 small, and fine detailing or miniaturization of the non-volatile storage element 100 is possible. Moreover, it is possible to make read current higher because it is possible to freely and appropriately set the interval between the first control gate 114 and the second control gate 116.

Figure 9A:
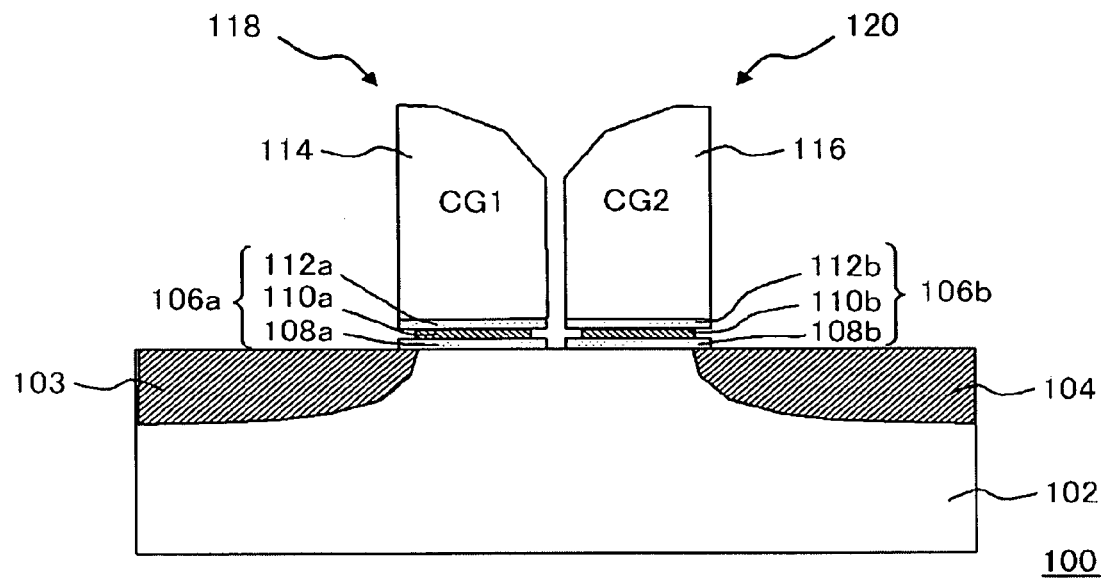
FIGS. 9A and 9B are cross-sectional views showing a further example of a non-volatile storage element of an embodiment of the present invention.
Figure 9B:
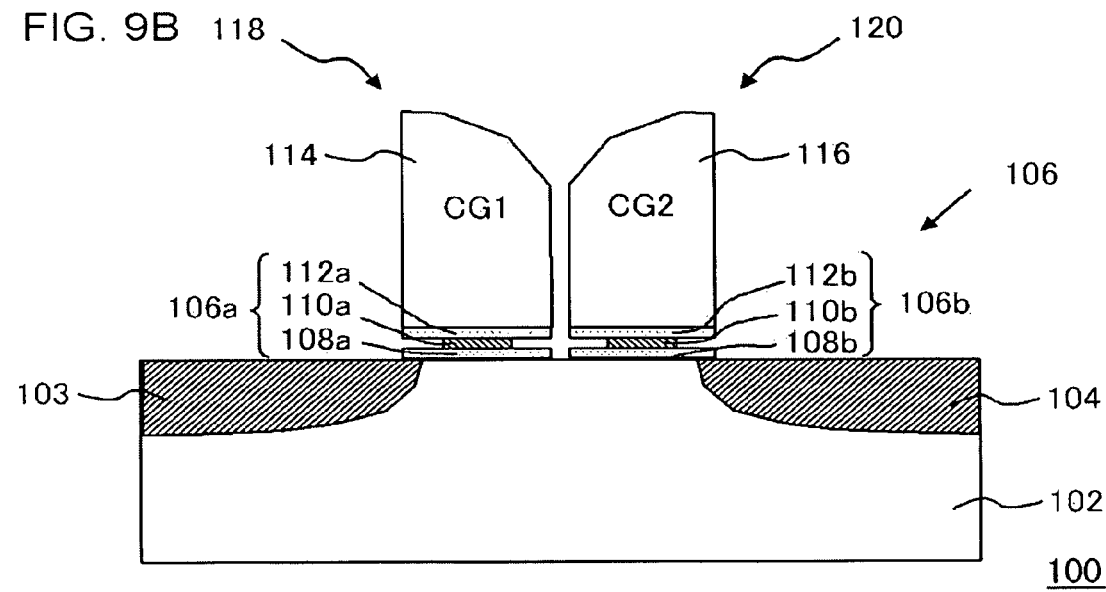

FIGS. 9A and 9B are cross-sectional views showing a further example of the non-volatile storage element 100 shown in FIG. 1.

Here, the first silicon nitride film 110a (first electron trapping film) of the first memory region 106a below the first control gate 114 and the second silicon nitride film 110b (second electron trapping film) of the second memory region 106b below the second control gate 116 are such that, in a cross-section in a gate length direction, at least one end is positioned on the inside of the end part of the first control gate 114 and the second control gate 116. A specific description is given in the following.

The non-volatile storage element 100 shown in FIG. 9A is such that, at the first memory region 106a and the second memory region 106b, the first silicon nitride film 110a and the second silicon nitride film 110b are formed with widths narrower than the first lower silicon oxide film 108a and the first upper layer silicon oxide film 112a, and the second lower layer silicon oxide film 108b and the second upper layer silicon oxide film 112b. Referring to FIGS. 8A and 8B, as described above, in the event that the first memory region 106a or the second memory region 106b stores electrons, the read current in reverse bias and forward bias is different depending on the width of the electron trapping region. Because of this, it is necessary for width of the electron trapping region to be controlled in an appropriate manner. In other words, the width of the electron trapping region can be optimized in advance so that even if electrons are injected into regions outside of the electron trapping region, these electrons cannot be trapped. Namely, it is preferable to form the cell structure in such a manner that the width of the electron trapping film itself is set to the desired dimension. In this embodiment, control is exerted so that the widths of the first silicon nitride film 110a and the second silicon nitride film 110b constituting an electron trapping film are of the desired dimensions.

According to the non-volatile storage element 100 of the configuration shown in FIGS. 9A and 9B, in a cross-section in a gate length direction, it is possible to set the length of the first silicon nitride film 110a and the second silicon nitride film 110b in an appropriate manner independent from the length of the first control gate 114 and the second control gate 116. As a result, for example, in a cross-section on a gate length direction of the first control gate 114 and the second control gate 116, it is possible to exert appropriate control in order that the width of the first silicon nitride film 110a and the second silicon nitride film 110b exhibits the desired characteristics regardless of the lengths of the first control gate 114 and the second control gate 116.

Further, as with the non-volatile storage element 100 shown in FIG. 9A, the non-volatile storage element 100 shown in FIG. 9B is such that, at the first memory region 106a and the second memory region 106b, the first silicon nitride film 110a and the second silicon nitride film 110b are formed with widths narrower than the first lower silicon oxide film 108a and the first upper layer silicon oxide film 112a, and the second lower layer silicon oxide film 108b and the second upper layer silicon oxide film 112b. Further, the first silicon nitride film 110a and the second silicon nitride film 110b are formed in such a manner as to not overlap with the impurity diffusion region 103 and the impurity diffusion region 104. The positioning of the electron trapping region away from the end of the impurity diffusion region has the effect of alleviating the influence (so-called disturbance) of changes in potential of the impurity diffusion region on data retention characteristics.

Figure 10A:
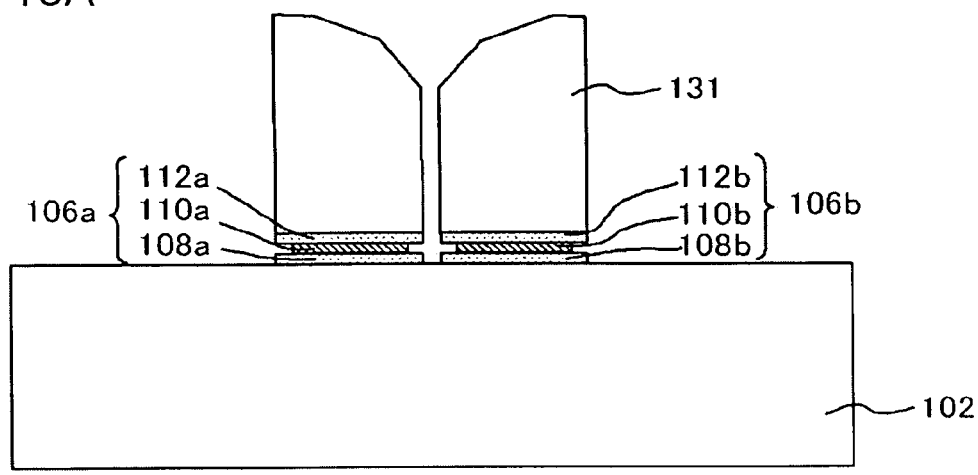
FIGS. 10A and 10B are cross-sectional views of a process showing a procedure for manufacturing the non-volatile storage element shown in FIGS. 9A and 9B.
Figure 10B:
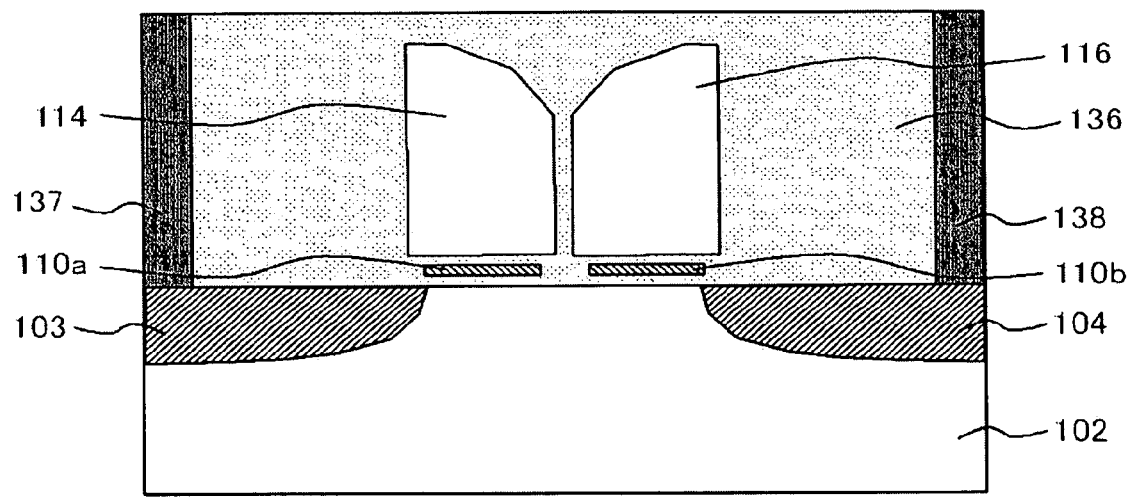

Further, although not shown in FIGS. 9A and 9B, the first cell 118 and the second cell 120 are embedded using a HTO film 136 as shown in FIG. 10B described later. The non-volatile storage element 100 includes an insulating film 136 constituted by a HTO film 136 or the like embedded between the first control gate 114 and the second control gate 116.

FIGS. 10A and 10B are cross-sectional views of a process showing part of a procedure for manufacturing the non-volatile storage element 100 shown in FIGS. 9A and 9B.

In this example also, the first memory region 106a, the second memory region 106b, and the polysilicon 131 are formed on the silicon substrate 102 using the same procedure as described with reference to FIGS. 3A to 3C, and FIGS. 4D and 4E. Continuing on, the first silicon nitride film 110a and the second silicon nitride film 110b are selectively removed by wet-etching using an etchant that can selectively remove the silicon nitride film at the whole of the upper surface of the silicon substrate 102. Here, phosphoric acid heated to, for example, 70 degrees centigrade, may be used as the etchant. The speed of etching the silicon nitride film using heated phosphoric acid is 5 angstrom per minute, with superior selective control being executed so as to only remove the first silicon nitride film 110a and the second silicon nitride film 110b, so that the silicon and silicon oxide films are not etched. As a result, the first silicon nitride film 110a and the second silicon nitride film 110b are respectively removed from the side of the first cell 118 and the second cell 120, and the first memory region 106a and the second memory region 106b of a structure where the width of the first silicon nitride film 110a and the second silicon nitride film 110b is narrower than that of the first lower silicon oxide film 108a and the first upper layer silicon oxide film 112a, and the second lower layer silicon oxide film 108b and the upper layer silicon oxide film 112 are formed (FIG. 10A).

Moreover, in a further example, the silicon nitride film 110 can be selectively removed by dry etching by appropriately setting bias conditions for, for example, plasma etching.

After this, a HTO film is embedded between the first control gate 114 and the second control gate 116 by depositing a HTO film to a thickness in the order of 20 nm and etching back, while at the same time a HTO side wall is formed at the side of the first control gate 114 and the second control gate 116. Next, ion injection is carried out, and the impurity diffusion region 103 and the impurity diffusion region 104 are formed on both sides of the first cell 118 and the second cell 120. Next, an HTO film 136 is deposited on the first cell 118 and the second cell 120. After this, at the HTO film 136, after contact holes connecting the impurity diffusion region 103 and the impurity diffusion region 104 are formed, these are filled in with metal material, and the metal interconnect 137 and the metal interconnect 138 are formed (FIG. 10B). As a result of the above procedure, the non-volatile storage element 100 containing the first cell 118 and the second cell 120 of the configuration shown in FIG. 9A is formed. By making the time wet etching using heated phosphoric acid described above with reference to FIG. 10A is carried out for long, the non-volatile storage element 100 containing the first cell 118 and the second cell 120 shown in FIG. 9B is formed.

As described above, according to the non-volatile storage element 100 shown in FIGS. 9A and 9B, it is possible to set the length of the first silicon nitride film 110a and the second silicon nitride film 110b in an appropriate manner independently from the length of the first control gate 114 and the second control gate 116. As a result, for example, in a cross-section in a gate length direction of the first control gate 114 and the second control gate 116, it is possible to exert appropriate control in order that the width of the first silicon nitride film 110a and the second silicon nitride film 110b exhibits the desired characteristics regardless of the lengths the first control gate 114 and the second control gate 116.

Further, in this embodiment, in a cross-section in a gate length direction, the length of the first silicon nitride film 110a below the first control gate 114 and the length of the second silicon nitride film 110b below the second control gate 116 is formed to be less than the length of the first control gate 114 and the length of the second control gate 116, respectively. As a result, it is possible to restrict the range of movement of electrons trapped in the first silicon nitride film 110a and the second silicon nitride film 110b, and it is possible to control movement of captured electrons due to an own electric field due to captured electrons and operating bias. As a result, it is possible to improve read characteristics and retention characteristics of the non-volatile storage element 100.

Second Embodiment

Figure 11:
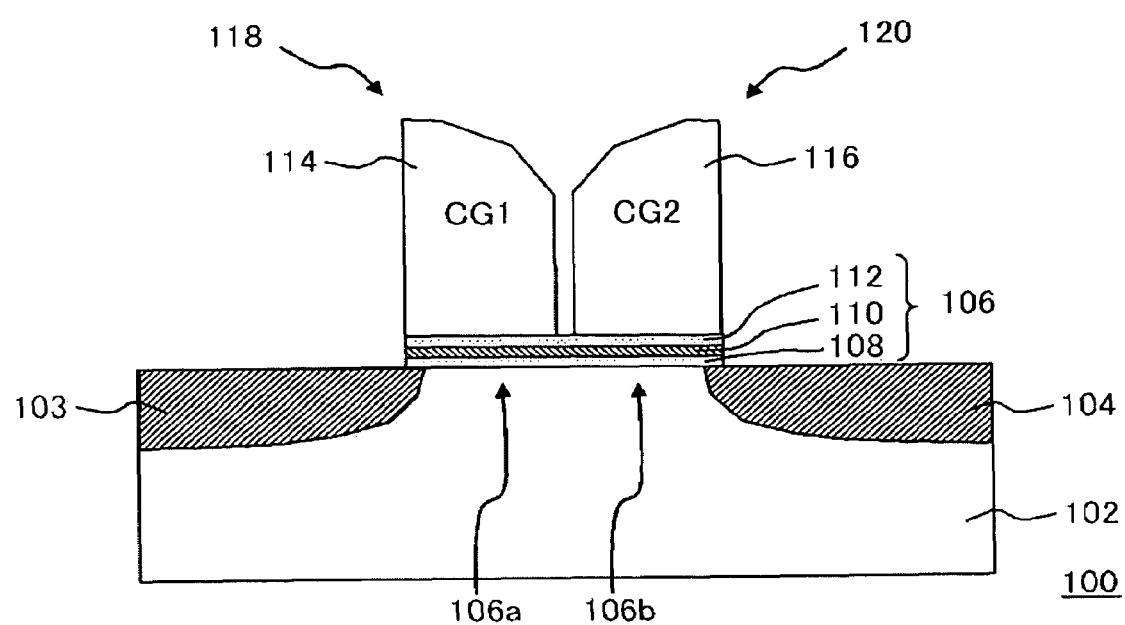
FIG. 11 is a cross-sectional view showing a configuration for a unit cell of a non-volatile storage element of an embodiment of the present invention.

FIG. 11 is a cross-sectional view showing a configuration for a unit cell of a non-volatile storage element 100 of this embodiment.

This embodiment differs from the non-volatile storage element 100 of the first embodiment with regards to the point that the memory region 106 is formed below a gap between the first control gate 114 and the second control gate 116. Namely, in this embodiment, the memory region 106 is formed continuously so as to span from below the first control gate 114 to below the second control gate 116. With this configuration also, the silicon nitride film 110 of the memory region 106 extends only in a horizontal direction in a direction within the substrate plane and it is therefore possible to suppress dispersion of electrons trapped in the silicon nitride film 110. Further, as described above, it is possible to control an interval between the first control gate 114 and the second control gate 116 with great precision, and fine detailing of the non-volatile storage element 100 is also possible. Moreover, it is possible to increase read current because it is possible to freely and appropriately set the interval between the first control gate 114 and the second control gate 116, as with the first embodiment. At the memory region 106, the first memory region 106a under the first control gate 114 functions as memory of the first cell 118, and the second memory region 106b under the second control gate 116 functions as memory of the second cell 120.

Further, although not shown in FIG. 11, at the non-volatile storage element 100, a silicon oxide film 140 (see FIG. 12C) is embedded between the first control gate 114 and the second control gate 116.

In this embodiment, the silicon nitride film 110 of the memory region 106 is such that, in a cross-section in a gate length direction, a region right below the first control gate 114 and the second control gate 116 is formed to a width of less than 60 nm.

FIGS. 12A to 12C and FIGS. 13D to 13F are cross-sectional views of processes showing a procedure for manufacturing the non-volatile storage element 100 of this embodiment.

In addition to the manufacturing method described in the first embodiment, the method of manufacturing the non-volatile storage element 100 of this embodiment includes forming the silicon oxide film 140 (protective film) covering a region between the first control gate 114 and the second control gate 116 before a process of selectively removing the silicon nitride film 132.

Figure 12A:
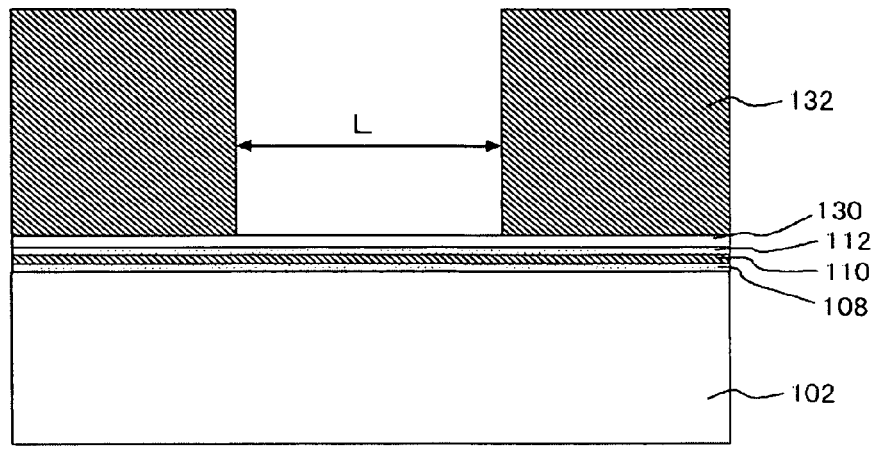
FIGS. 12A to 12C are cross-sectional views of processes showing a procedure for manufacturing the non-volatile storage element of an embodiment of the present invention.
Figure 12B:
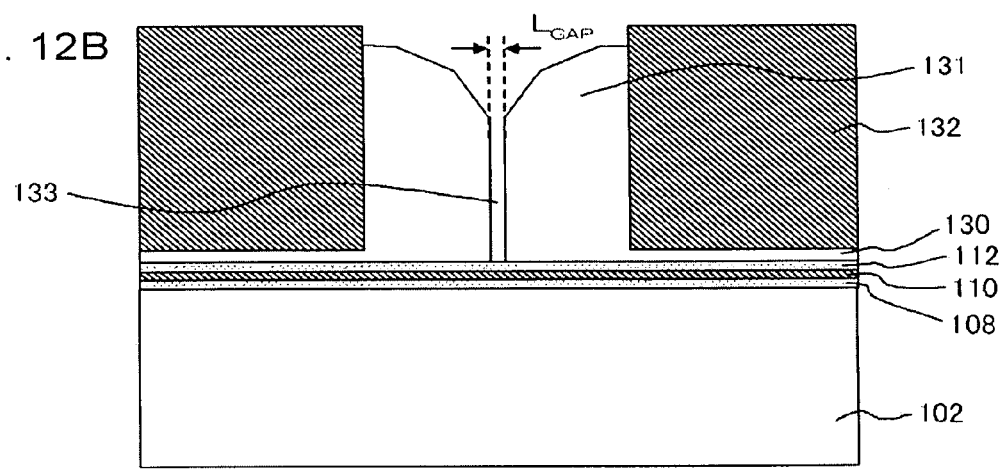

As with the description referring to FIGS. 3A and 3B described in the first embodiment, the memory region 106, the polysilicon 130, the silicon nitride film 132, and the polysilicon 131 are formed on the silicon substrate 102 (refer to FIGS. 12A and 12B).

Figure 12C:
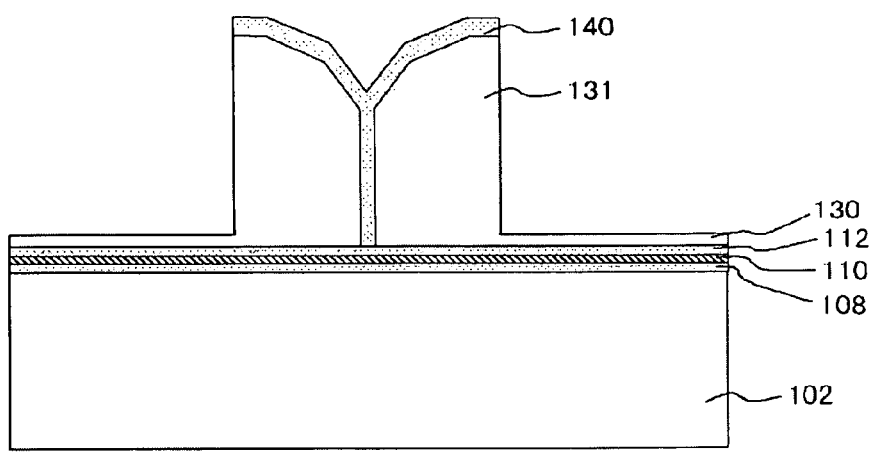

After this, the surface of the polysilicon 131 is oxidized so as to form the silicon oxide film 140. Here, the film thickness of the silicon oxide film 140 can be made to be 15 nm. Thus, the gap between the first control gate 114 and the second control gate 116 is filled with the silicon oxide film 140. Continuing on, the silicon nitride film 132 is removed by wet etching (FIG. 12C). Next, the exposed polysilicon 130 is removed by etching back. At this time, the polysilicon 131 is not etched back due to being covered by the silicon oxide film 140.

Figure 13D:
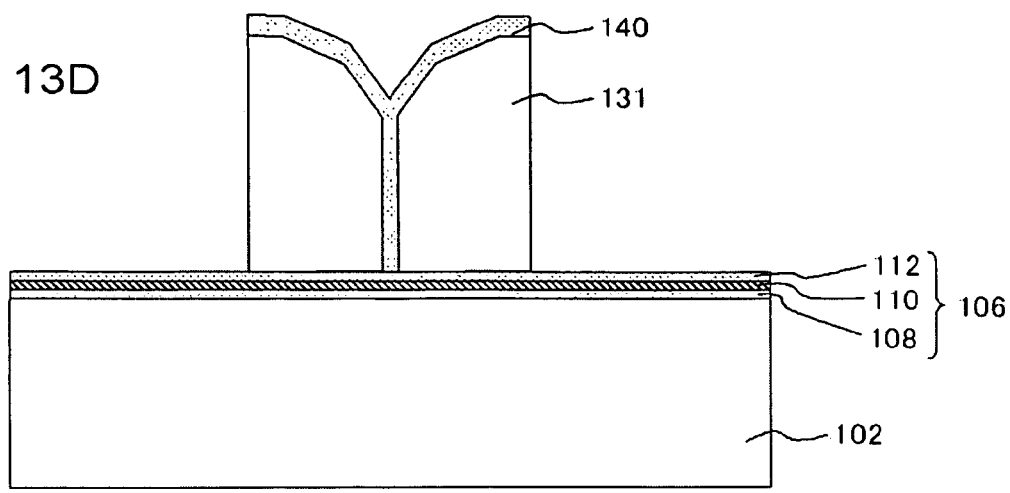
FIGS. 13D to 13F are cross-sectional views of processes showing a procedure for manufacturing the non-volatile storage element of an embodiment of the present invention.
Figure 13E:
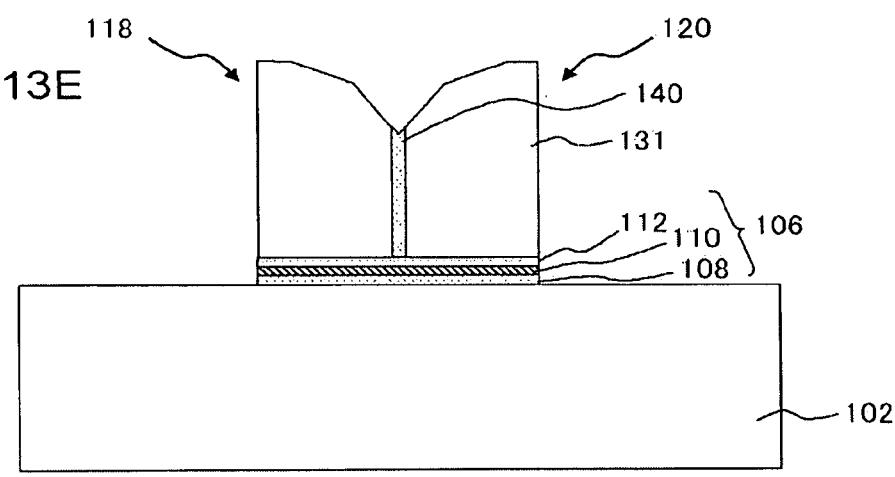

After this, the upper layer silicon oxide film 112, the silicon nitride film 110, and the lower layer silicon oxide film 108 are selectively removed by etching back taking the polysilicon 131 as a mask. At this time, the silicon oxide film 140 on the polysilicon 131 and the polysilicon 131 are also partially removed. Thus, the first cell 118 and the second cell 120 are formed (FIG. 13E).

Figure 13F:
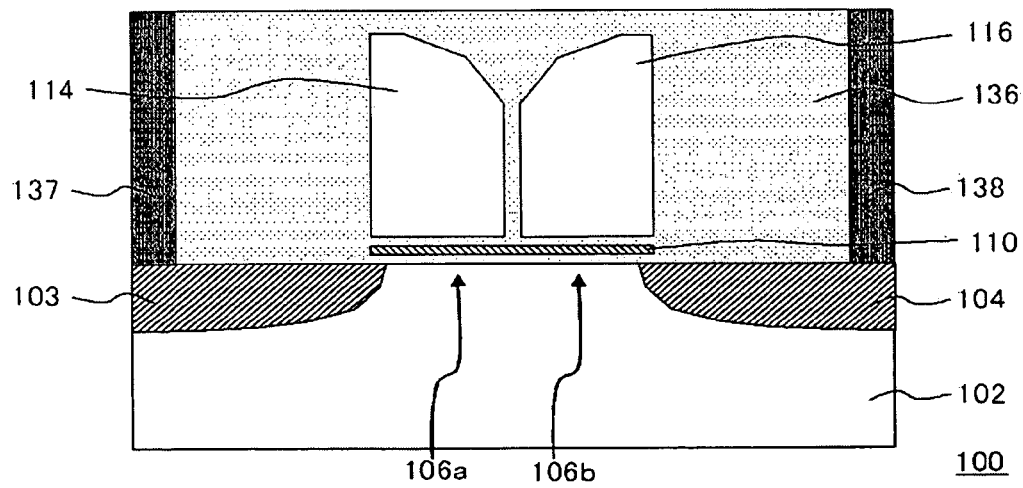

Next, as described in the first embodiment, a HTO film side-wall is formed on the side surface of the polysilicon 131. After this, ion injection is carried out, and the impurity diffusion region 103 and the impurity diffusion region 104 are formed on both sides of the first cell 118 and the second cell 120, respectively. Next, an HTO film 136 is deposited on the first cell 118 and the second cell 120. Here, either of the silicon oxide film 140 and the HTO film 136 are silicon oxide films, and are therefore shown as being integral. After this, the metal interconnect 137 and the metal interconnect 138 connected to the impurity diffusion region 103 and the impurity diffusion region 104 are formed at the HTO film 136 (FIG. 13F). The non-volatile storage element 100 of this embodiment is formed using the above procedure.

Figure 14:
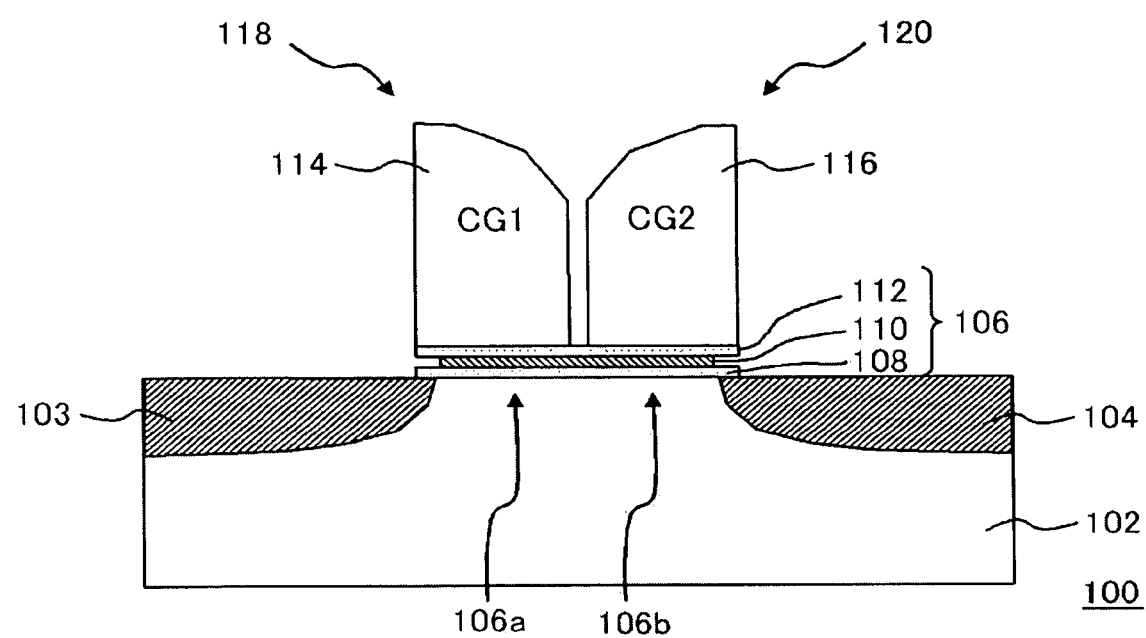
FIG. 14 is a cross-sectional view showing another example of a non-volatile storage element of an embodiment of the present invention.

FIG. 14 is a cross-sectional view showing a further example of the non-volatile storage element 100 shown in FIG. 11. Here, at the memory region 106 of the non-volatile storage element 100, the silicon nitride film 110 is formed with a width narrower than that of the lower layer silicon oxide film 108 and the upper layer silicon oxide film 112. According to the non-volatile storage element 100 of this configuration, it is possible to set the length of the silicon nitride film 110 in a cross-section in a gate length direction in an appropriate manner independent from the length of the first control gate 114 and the second control gate 116.

Further, although not shown in FIG. 14, the silicon oxide film 140 embedded between the first cell 118 and the second cell 120 is formed.

Figure 15A:
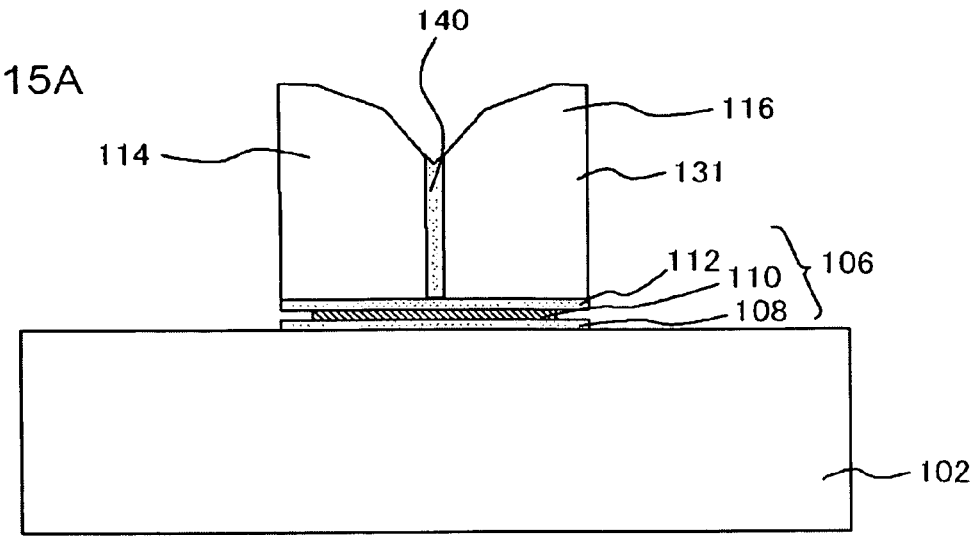
FIGS. 15A and 15B are cross-sectional views of a process showing a procedure for manufacturing the non-volatile storage element shown in FIG. 14.
Figure 15B:
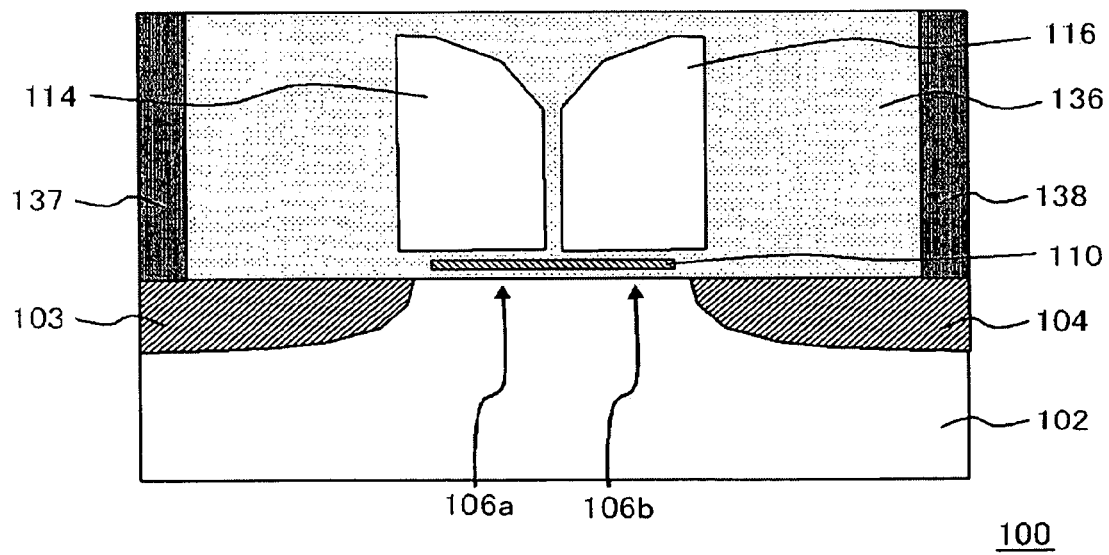

FIGS. 15A and 15B are cross-sectional views of a process showing part of a procedure for manufacturing the non-volatile storage element 100 shown in FIG. 14. In this example also, the memory region 106, the polysilicon 131 (the first control gate 114 and the second control gate 116) and the silicon oxide film 140 are formed on the silicon substrate 102 in the same order as described with reference to FIGS. 12A to 12C, and FIGS. 13D and 13E. Continuing on, wet-etching is carried out using etchant to selectively remove the silicon nitride film 110. Here, heated phosphoric acid may be used as the etchant. As a result, the silicon nitride film 110 is removed from the side of the first cell 118 and the second cell 120, and the memory region 106 is formed constructed in such a manner that the width of the silicon nitride film 110 is narrower than the width of the lower layer silicon oxide film 108 and the upper layer silicon oxide film 112 (FIG. 15A).

After this, ion injection is carried out, and the impurity diffusion region 103 and the impurity diffusion region 104 are formed on both sides of the first cell 118 and the second cell 120. Next, an HTO film 136 is deposited on the first cell 118 and the second cell 120. Then, the metal interconnect 137 and the metal interconnect 138 connected to the impurity diffusion region 103 and the impurity diffusion region 104 are formed at the HTO film 136 (FIG. 15B). As a result of the above procedure, the non-volatile storage element 100 containing the first cell 118 and the second cell 120 of the configuration shown in FIG. 14 is formed.

As described above, as for the non-volatile storage element 100 of this embodiment, as with the non-volatile storage element 100 of the first embodiment, it is possible to make the interval between the first control gate 114 and the second control gate 116 small. Thus, fine-detailing of the non-volatile storage element 100 can be achieved. Further, as it is possible to appropriately and freely set the interval between the first control gate 114 and the second control gate 116, it is also possible to arrange the two control gates in such a manner that read current of the silicon nitride film 110 becomes an appropriate value.

Third Embodiment

Figure 16:
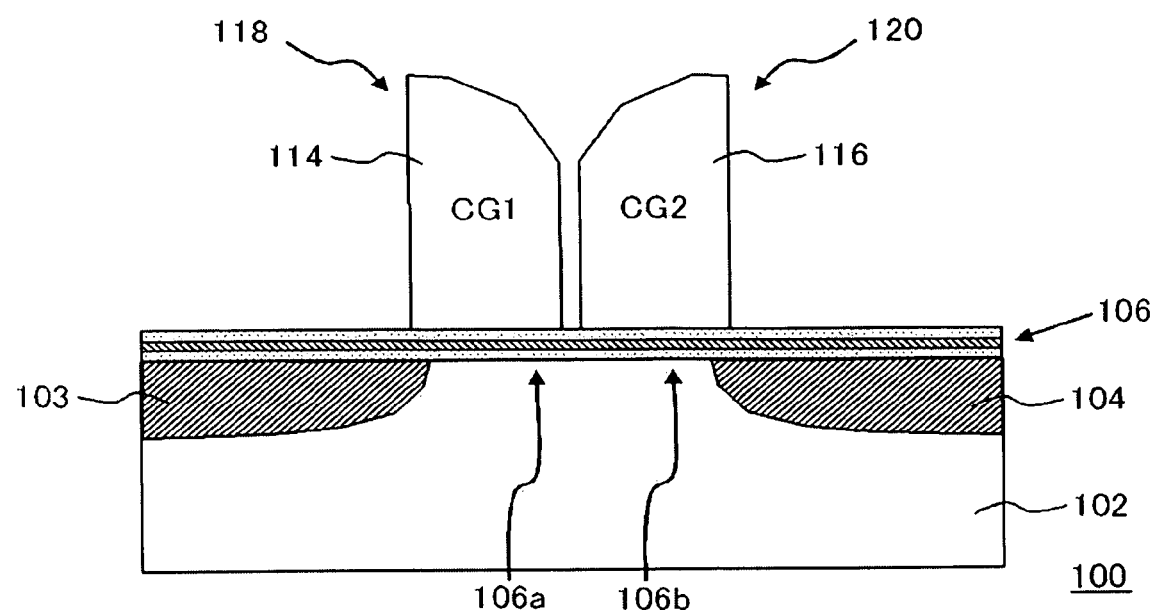
FIG. 16 is a cross-sectional view showing a configuration for a unit cell of a non-volatile storage element of an embodiment of the present invention.

FIG. 16 is a cross-sectional view showing a configuration for a unit cell of a non-volatile storage element 100 of this embodiment.

This embodiment differs from the non-volatile storage element 100 of the second embodiment in that the memory region 106 is formed so as to span across the upper surface of the impurity diffusion region 103 and the impurity diffusion region 104 formed at the side of the first control gate 114 and the second control gate 116. According to the non-volatile storage element 100 of this embodiment, the manufacturing procedure can be further simplified. With this configuration also, the silicon nitride film 110 of the memory region 106 extends only in a horizontal direction in a direction within the substrate plane and find detailing of the non-volatile storage element 100 is therefore possible. Further, it is possible to increase read current because it is possible to freely and appropriately set the interval between the first control gate 114 and the second control gate 116.

Moreover, although not shown in FIG. 16, the silicon oxide film 140 is formed between the first cell 118 and the second cell 120, and at the non-volatile storage element 100, the silicon oxide film 140 is provided embedded between the first control gate 114 and the second control gate 116.

The non-volatile storage element 100 of this configuration is manufactured using the same procedure as described with reference to FIGS. 12A to 12C, and FIG. 13D. After forming a structure of the configuration shown in FIG. 13D, ion injection is carried out via the memory region 106, and the impurity diffusion region 103 and the impurity diffusion region 104 are formed on both sides of the first cell 118 and the second cell 120. Next, an HTO film 136 is deposited on the first cell 118 and the second cell 120. Then, the metal interconnect 137 and the metal interconnect 138 connected to the impurity diffusion region 103 and the impurity diffusion region 104 are formed at the HTO film 136. As a result of the above procedure, the non-volatile storage element 100 containing the first cell 118 and the second cell 120 of the configuration shown in FIG. 16 is formed.

In the above, even at the non-volatile storage element 100 of this embodiment, as with the non-volatile storage element 100 of the first embodiment, it is possible to make the interval between the first control gate 114 and the second control gate 116 small. Thus, fine-detailing of the non-volatile storage element 100 is possible. Further, as it is possible to appropriately and freely set the interval between the first control gate 114 and the second control gate 116, it is also possible to arrange the two control gates in such a manner that read current of the silicon nitride film 110 becomes an appropriate value. This makes it possible to further simplify the manufacturing process.

Fourth Embodiment

Figure 17:
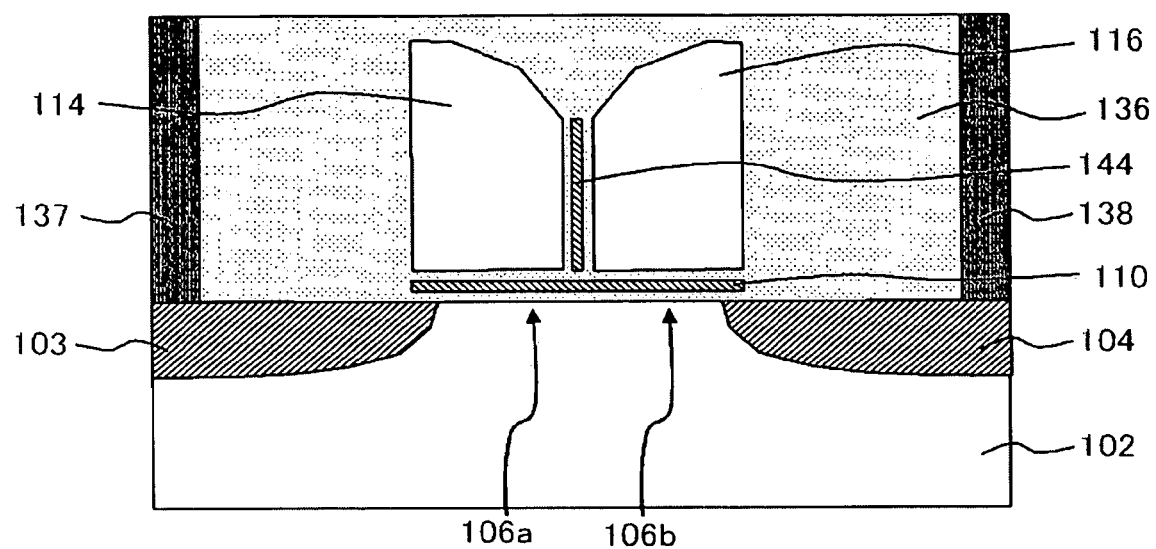
FIG. 17 is a cross-sectional view showing a configuration for a unit cell of a non-volatile storage element of an embodiment of the present invention.

FIG. 17 is a cross-sectional view showing a configuration for a unit cell of the non-volatile storage element 100 of this embodiment.

This embodiment differs from the non-volatile storage element 100 of the second embodiment with regards to the point that a silicon nitride film 144 is formed between the first control gate 114 and the second control gate 116. In this way, it is possible to improve the withstand voltage of the first cell 118 and the second cell 120 by providing the silicon nitride film 144 between the two control gates.

Further, a silicon oxide film is formed between the silicon nitride film 144 and the silicon nitride film 110, and the silicon nitride film 144 and the silicon nitride film 110 are not connected. Namely, the silicon nitride film 144 does not function as an electron trapping film and the film thickness of the silicon nitride film 144 therefore does not have to be a thickness taking into consideration the capture of electrons. Because of this, even at the non-volatile storage element 100 of this embodiment, it is possible to make the interval between the first control gate 114 and the second control gate 116 small. Thus, fine-detailing of the non-volatile storage element 100 is possible.

Further, with the non-volatile memory element disclosed in Japanese Laid-open patent publication NO. 2003-17600, two ONO films are formed between two control gates. The spacing of these two control gates therefore cannot be made narrower than twice the minimum film thickness of the ONO film required from the point of view of retention characteristics. At the non-volatile storage element 100 of this embodiment, simply by just forming one stacked film composed of the silicon oxide film, the silicon nitride film 144, and the silicon oxide film between the first control gate 114 and the second control gate 116, it is possible to make the interval between the first control gate 114 and the second control gate 116 small, and fine-processing of the non-volatile storage element 100 can be achieved.

Figure 18A:
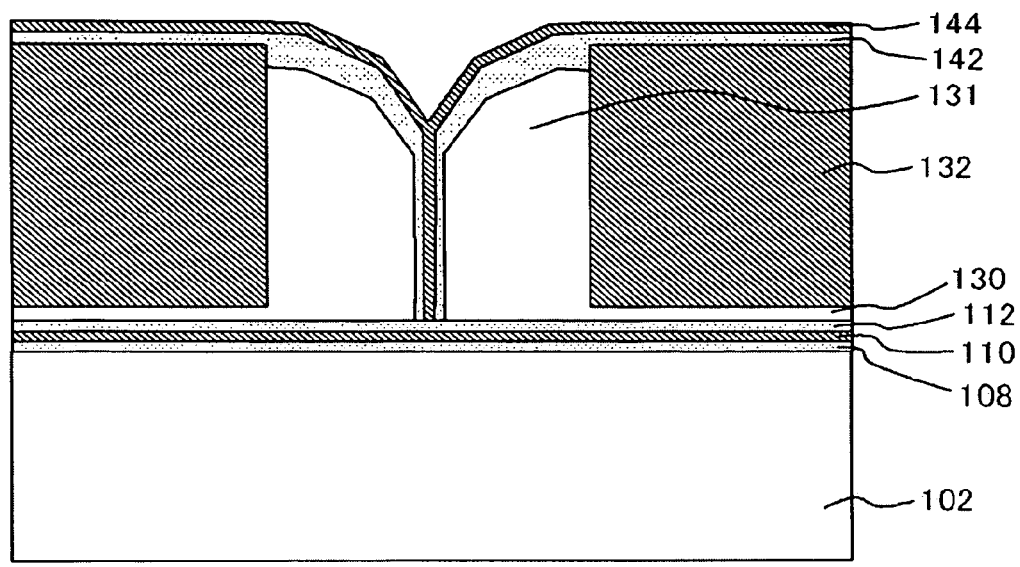
FIGS. 18A and 18B are cross-sectional views of processes showing a procedure for manufacturing the non-volatile storage element of an embodiment of the present invention.
Figure 18B:
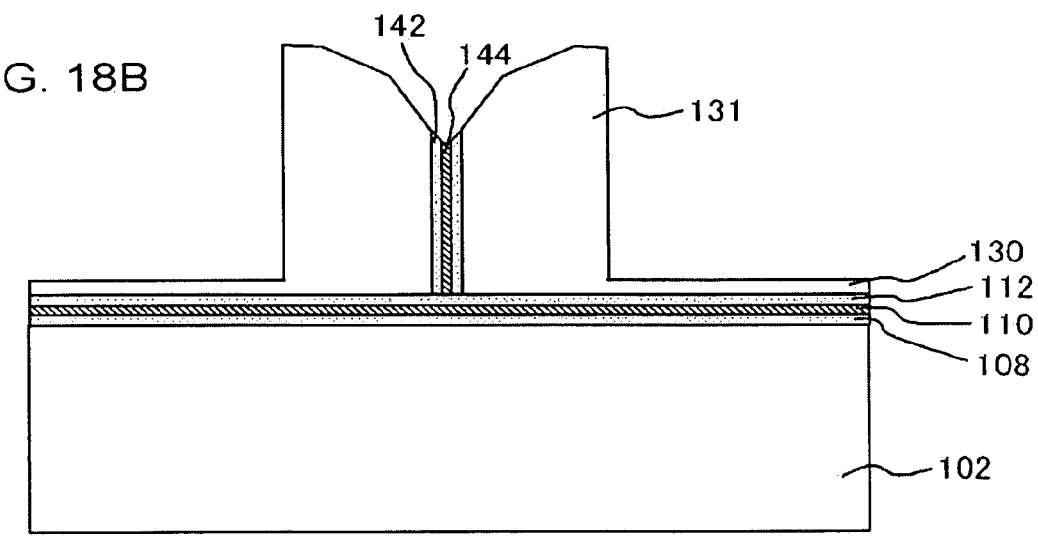

FIGS. 18A and 18B are cross-sectional views of processes showing a procedure for manufacturing the non-volatile storage element 100 of this embodiment.

First, in the same order as with the description referring to FIGS. 12A and 12B in the second embodiment, the memory region 106, the polysilicon 130, the silicon nitride film 132, and the polysilicon 131 are formed on the silicon substrate 102. At this time, the width $L_{GAP}$ of the gap between two blocks of the polysilicon 131 is, for example, preferably equal to or less than 30 nm, as described in the second embodiment. In this embodiment, the width $L_{GAP}$ can be taken to be, for example, 15 nm. Continuing on, an insulating film 142 is formed by, for example, CVD techniques over the whole of the silicon substrate 102. The insulating film 142 can be a silicon oxide film or a HTO film. The insulating film 142 is formed to a thickness that does not completely embed the gap between two blocks of the polysilicon 131. Next, the silicon nitride film 144 is formed by, for example, CVD techniques over the whole of the silicon substrate 102. In this way, it is possible to fill in the gap between the two blocks of the polysilicon 131 using the silicon nitride film 144 and the insulating film 142 (FIG. 18A).

After this, the silicon nitride film 144 and the insulating film 142 on the upper surface of the polysilicon 131 and the silicon nitride film 132 are removed by etching back. Continuing on, the silicon nitride film 132 is removed by wet etching (FIG. 18B).

After this, it is possible to make the non-volatile storage element 100 of this embodiment using the same procedure as described with reference to FIGS. 13D to 13F for the second embodiment.

Figure 19:
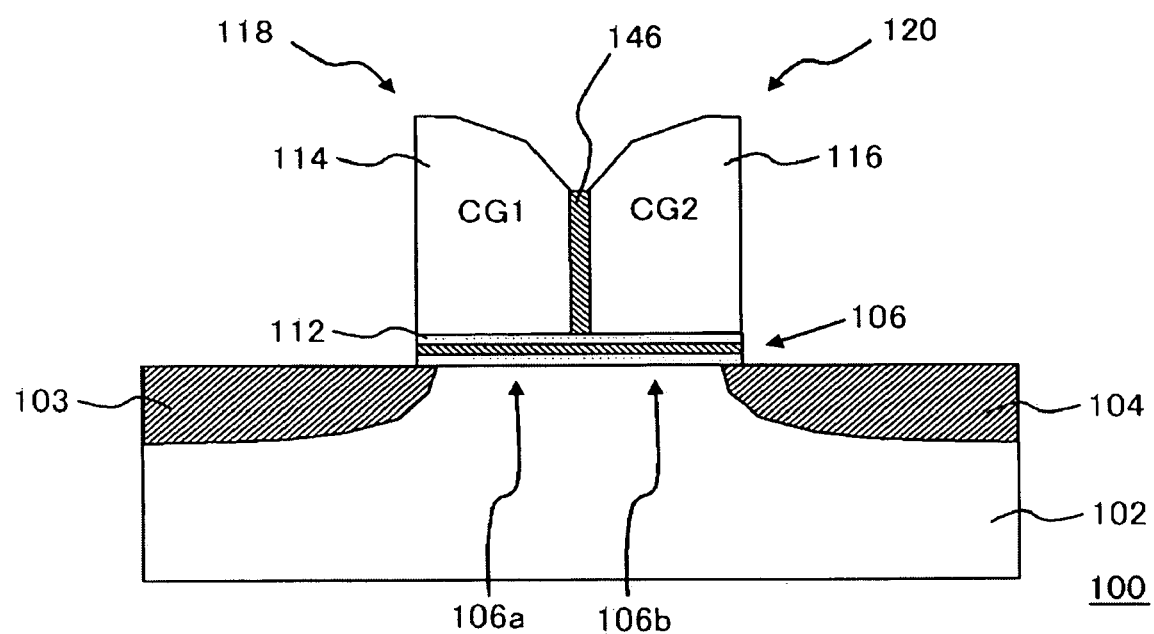
FIG. 19 is a cross-sectional view showing a further example of a non-volatile storage element of an embodiment of the present invention.
Figure 20:
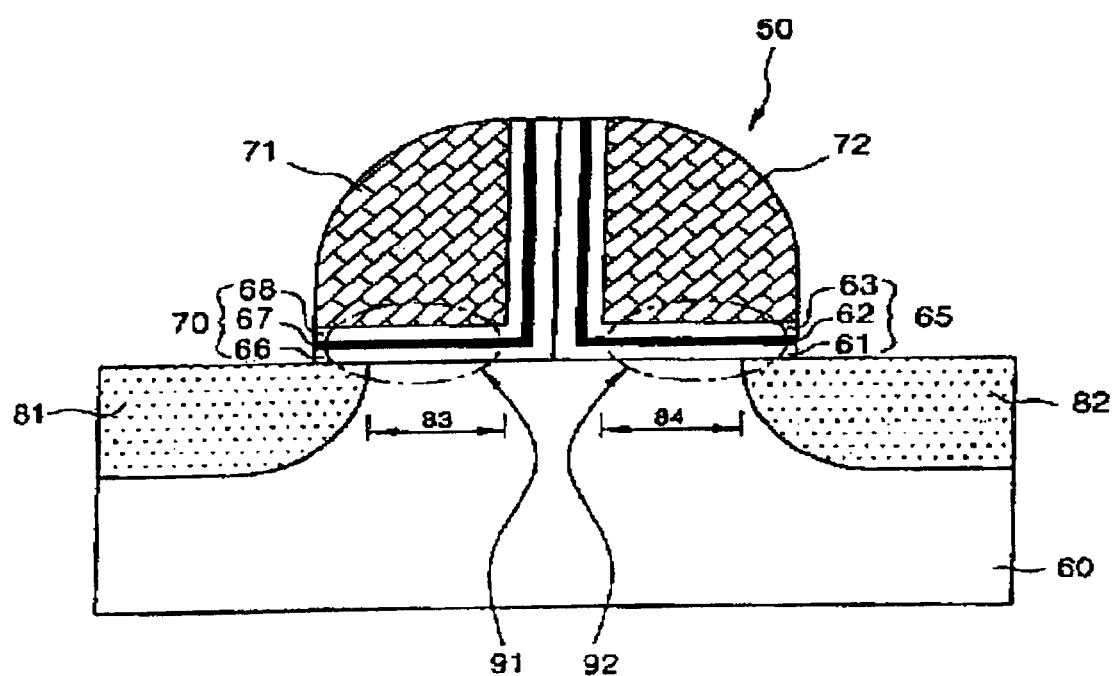
FIG. 20 is a schematic view showing a configuration of the related art.

FIG. 19 is a cross-sectional view showing another example of the non-volatile storage element 100 shown in FIG. 17.

Here, only a silicon nitride film 146 is formed between the first control gate 114 and the second control gate 116.

The silicon nitride film 146 can be formed by nitriding of the surface of the polysilicon 131 using a similar method to that described with reference to FIG. 12C in the second embodiment. Further, in another example, this can be formed by forming a silicon nitride film using, for example, CVD techniques, over the whole of the silicon substrate 102 using a method similar to that described with reference to FIG. 18A in this embodiment, and then etching back the silicon nitride film.

Further, with the above configuration, it is possible to make an interval between the first control gate 114 and the second control gate 116 small, and fine detailing of the non-volatile storage element 100 is possible.

Here, a description is given taking the silicon nitride film 146 as an example but this film can also be an HTO film.

In the above, even at the non-volatile storage element 100 of this embodiment, as with the non-volatile storage element 100 of the first embodiment, it is possible to make the interval between the first control gate 114 and the second control gate 116 small. Thus, fine-detailing of the non-volatile storage element 100 is possible. Further, as it is possible to appropriately and freely set the interval between the first control gate 114 and the second control gate 116, it is also possible to arrange the two control gates in such a manner that read current becomes an appropriate value.

In the above, a description is given of the embodiments of the present invention with reference to the drawings but this merely illustrates examples of the present invention, and various other configurations can also be adopted.

In the above, an example is described of the case where an electron trapping film is a silicon nitride film but this electron trapping film can also be configured from a plurality of dot-shaped substances provided spaced from each other. The dot-shaped substance may be a dot-shaped dielectric, dot-shaped semiconductor, or dot-shaped metal. The dot-shaped substance can be configured on a nano-scale and may be given various shapes such as spherical, semi-spherical, island-shaped, or columnar. In the event that the dot-shaped substance is spherical, the diameter can be taken to be approximately 5 to 10 nm. However, the size of the dot-shaped substance is by no means limited in this respect, and any size is appropriate providing that the configuration divides a memory region below one control gate into two or more regions. The dot-shaped substance can be a semiconductor including, for example, Si, Ge, Si—Ge, or the like, or a metal body or metal oxide including Al or high melting point metal such as Hf, Co, Ti, W, or the like. The dot-shaped substance may also be configured from metal atoms or clusters dispersed within a silicon oxide film. In this way, by forming the electron trapping film in a dot-shape, it is possible to keep flowing out of electrons to a minimum even in cases where part of an insulating film is damaged, and the reliability of the memory over a long period can be improved.

Further, the electron trapping film can also be made from polysilicon or metal material. Here, the metal material can be a metal body or metal oxide including Al, or high melting point metal such as Hf, Co, Ti, W or the like. The electrons trapped by the electron trapping film move within the electron trapping film due to a voltage applied at the time of a write/read operation or as a result of an own electric field formed by the trapped electrons themselves. When the width of the electron trapping film in the channel direction is longer than is necessary, the spatial density of the trapped electrons fluctuates and data retention characteristics deteriorate. At the non-volatile storage element of the present invention, the electron trapping film is not formed so as to extend as far as the side wall of the control gate, and the dispersion of trapped electrons within the electron trapping film can therefore be suppressed. Because of this, trapped electrons can be confined to within the energy wall formed at the field boundary of the electron trapping film and its surrounding insulating films even when the electron trapping film is constructed from a metal material of high electron mobility. This means that superior retention characteristics can be maintained. This theory applies even for films where material constituting the electron trapping film is formed continuously or where the construction uses a distributed dot-shaped substance.

In the second embodiment, forming the silicon oxide film 140 before removing the silicon nitride film 132 is shown but it is also possible to form a protective film covering a region between the first control gate 114 and the second control gate 116 after removing the silicon nitride film 132. Namely, the protective film covering the region between the first control gate 114 and the second control gate 116 may be formed at any step provided that the region between the first control gate 114 and the second control gate 116 is covered by the protective film when the stacked film constructed from the lower layer silicon oxide film 108, the silicon nitride film 110, and the upper layer silicon oxide film 112 is etched.

Further, it is also possible to construct the non-volatile storage element 100 by using an appropriate combination of the embodiments described above. For example, at the non-volatile storage element 100 constructed as shown in FIG. 16, a structure is adopted where a stacked film of insulating films constructed as shown in FIGS. 18A and 18B is formed between the first control gate 114 and the second control gate 116.

It is apparent that the present invention is not limited to the above embodiment, and may be modified and changed without departing from the scope and spirit of the invention.

What is claimed is:

1. A nonvolatile storage element, comprising:
   a semiconductor substrate;
   a memory region provided on said semiconductor substrate in the order of a first insulating film, an electron trapping film, and a second insulating film, an entirety of said electron trapping film being coplanar and parallel to a substrate plane direction; and
   a first control gate and a second control gate arranged next to each other on said memory region,
   wherein said electron trapping film is comprised of a first electron trapping film formed below said first control gate, and a second electron trapping film formed below said second control gate and provided distanced from said first electron trapping film, and
   wherein an end part of at least one of said first electron trapping film and said second electron trapping film is positioned at the inside of an end part of said first control gate and said second control gate, respectively, in a cross-section in a gate length direction.

2. A nonvolatile storage element, comprising:
   a semiconductor substrate;
   a memory region provided on said semiconductor substrate in the order of a first insulating film, an electron trapping film, and a second insulating film, an entirety of said electron trapping film being coplanar and parallel to a substrate plane direction; and
   a first control gate and a second control gate arranged next to each other on said memory region,
   wherein said electron trapping film is formed so as to be continuous so as to span from below said first control gate to below said second control gate, and
   wherein said electron trapping film is provided in such a manner that at least one end part is positioned at the inside of an end part of a region spanning from a region right under said first control gate to a region right under said second control gate in a cross-section in a gate length direction.

* * * * *